(12) United States Patent
Lee

(10) Patent No.: US 10,545,619 B2
(45) Date of Patent: Jan. 28, 2020

(54) DEVICE AND METHOD FOR DETECTING CAPACITIVE TOUCH SIGNAL

(71) Applicant: G2TOUCH Co., LTD, Seongnam (KR)

(72) Inventor: Sung Ho Lee, Hwaseong (KR)

(73) Assignee: G2TOUCH CO., LTD, Seongnam (KR)

( * ) Notice: Subject to any disclaimer, the term of this patent is extended or adjusted under 35 U.S.C. 154(b) by 151 days.

(21) Appl. No.: 15/555,050

(22) PCT Filed: Feb. 23, 2016

(86) PCT No.: PCT/KR2016/001740
§ 371 (c)(1),
(2) Date: Aug. 31, 2017

(87) PCT Pub. No.: WO2016/140455
PCT Pub. Date: Sep. 9, 2016

(65) Prior Publication Data
US 2018/0074613 A1    Mar. 15, 2018

(30) Foreign Application Priority Data
Mar. 5, 2015    (KR) ........................ 10-2015-0030825

(51) Int. Cl.
G06F 3/044    (2006.01)
G06F 3/041    (2006.01)
H03K 17/96    (2006.01)

(52) U.S. Cl.
CPC ............ G06F 3/044 (2013.01); G06F 3/0416 (2013.01); H03K 17/962 (2013.01); H03K 2017/9602 (2013.01)

(58) Field of Classification Search
CPC ...... G06F 3/044; G06F 3/0418; G06F 3/0416; G06F 3/0412; H03K 17/962; H03K 2017/9602
See application file for complete search history.

(56) References Cited

U.S. PATENT DOCUMENTS

2010/0110040 A1*  5/2010  Kim .................... G06F 3/0412
                                                345/174
2011/0193817 A1*  8/2011  Byun .................. G06F 3/0418
                                                345/174
(Continued)

FOREIGN PATENT DOCUMENTS

KR      10-1085086 B1   11/2011
KR      10-1197460 B1   11/2012
(Continued)

OTHER PUBLICATIONS

International Search Report for PCT/KR2016/001740 filed on Feb. 23, 2016.

*Primary Examiner* — Nitin Patel
*Assistant Examiner* — Amy Onyekaba

(57) ABSTRACT

The present invention relates to a device and a method for detecting a capacitive touch signal of a finger of a human body or a touch input means having similar conductive properties to the finger, and relates to a device and a method for detecting a capacitive touch signal, in which alternating driving voltage is applied to one side of a sensing equivalent capacitor formed between a sensing pad and a non-sensing pad, and a touch detection unit detects a voltage difference generated from the sensing pad according to the occurrence or non-occurrence of a touch, thereby determining whether the touch occurs or not.

18 Claims, 14 Drawing Sheets

(56) References Cited

U.S. PATENT DOCUMENTS

| | | | |
|---|---|---|---|
| 2011/0242050 A1* | 10/2011 | Byun | G06F 3/0418 345/174 |
| 2012/0062497 A1* | 3/2012 | Rebeschi | G06F 3/03545 345/174 |
| 2012/0062498 A1* | 3/2012 | Weaver | G06F 3/03545 345/174 |
| 2012/0062499 A1* | 3/2012 | Weaver | G06F 3/03545 345/174 |
| 2012/0092288 A1 | 4/2012 | Wadia | |
| 2012/0249457 A1* | 10/2012 | Chou | G06F 3/0418 345/173 |
| 2012/0262418 A1* | 10/2012 | Lee | G06F 3/044 345/174 |
| 2013/0050140 A1* | 2/2013 | Chu | G06F 3/0416 345/174 |
| 2013/0162595 A1* | 6/2013 | Lee | G06F 3/0418 345/174 |
| 2013/0181946 A1* | 7/2013 | Lee | G06F 3/044 345/174 |
| 2013/0271163 A1* | 10/2013 | Brunet | H03K 17/962 324/679 |
| 2013/0314373 A1* | 11/2013 | Kim | G06F 3/044 345/174 |
| 2013/0335376 A1* | 12/2013 | Lee | G06F 3/0416 345/174 |
| 2014/0184556 A1* | 7/2014 | Jo | G06F 3/0416 345/174 |
| 2014/0232691 A1* | 8/2014 | Lee | G06F 3/044 345/174 |
| 2014/0375609 A1* | 12/2014 | Kim | G06F 3/0418 345/174 |
| 2015/0009179 A1* | 1/2015 | Kim | G06F 3/044 345/174 |
| 2015/0091849 A1* | 4/2015 | Ludden | G06F 3/0412 345/174 |

FOREIGN PATENT DOCUMENTS

| | | |
|---|---|---|
| KR | 10-2014-0010788 A | 1/2014 |
| KR | 10-2014-0121658 A | 10/2014 |
| WO | WO2014168399 A1 * | 10/2014 |

* cited by examiner

[FIG. 1]
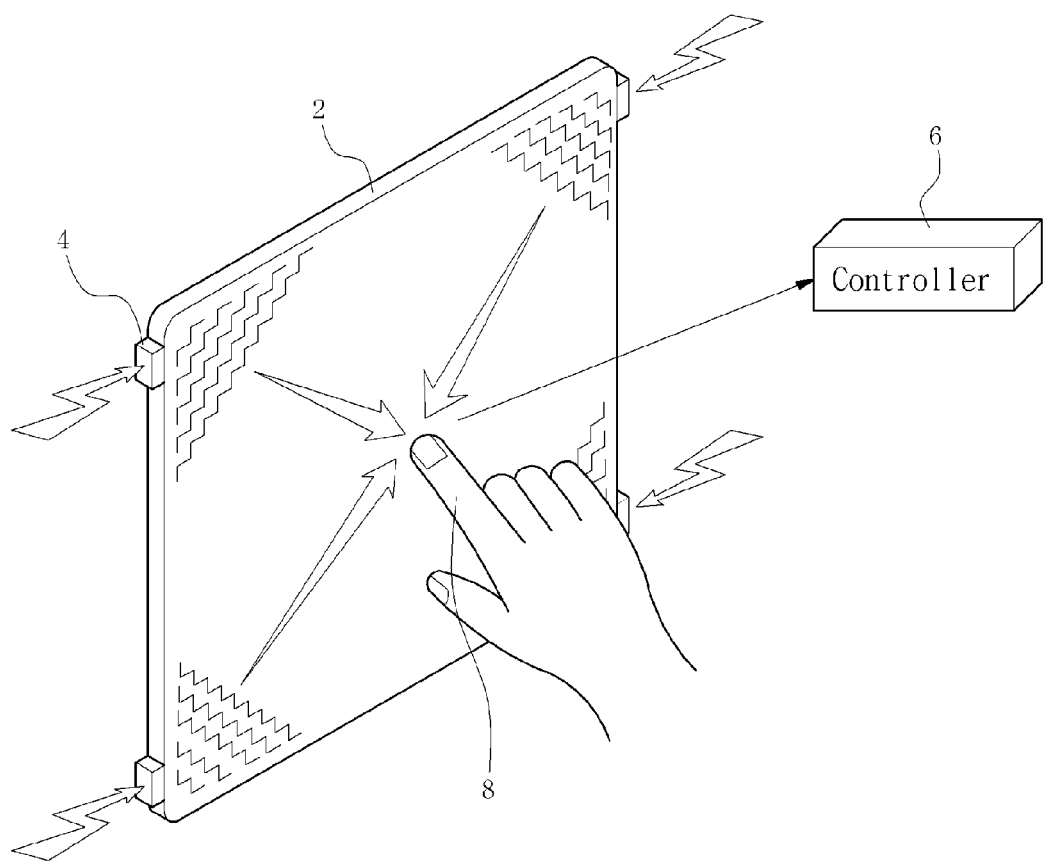
<Prior Art>

[FIG. 2]
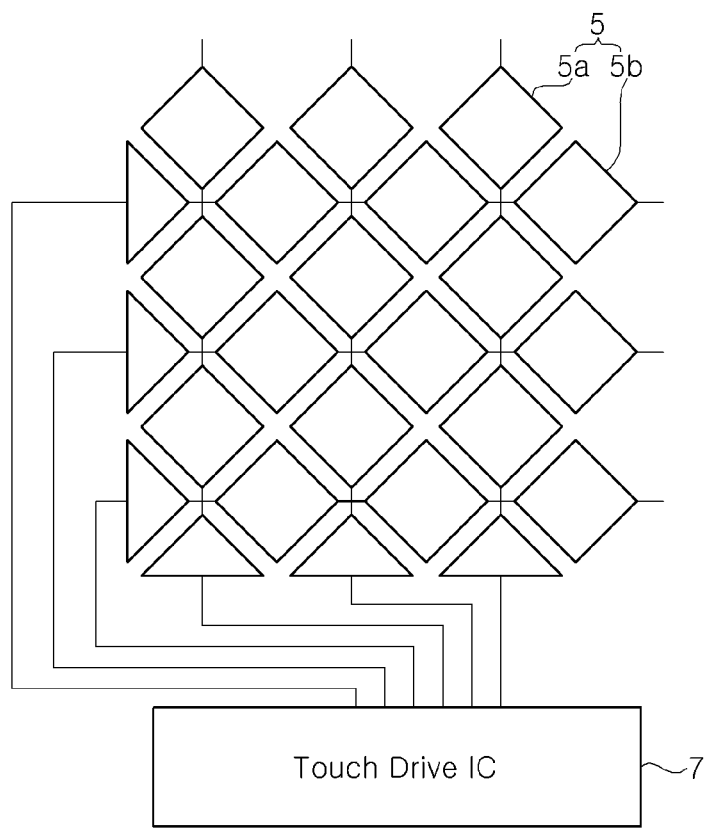
<Prior Art>

[FIG. 3]
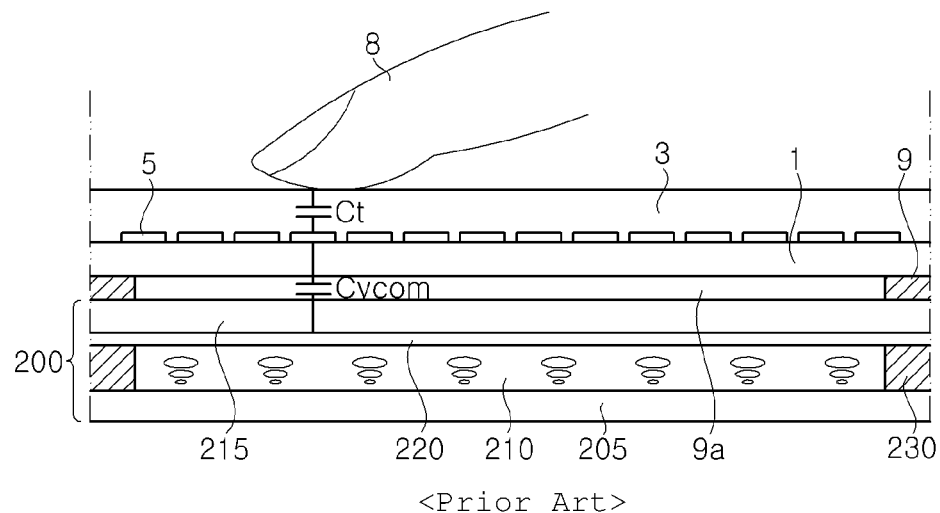
<Prior Art>
[FIG. 4]
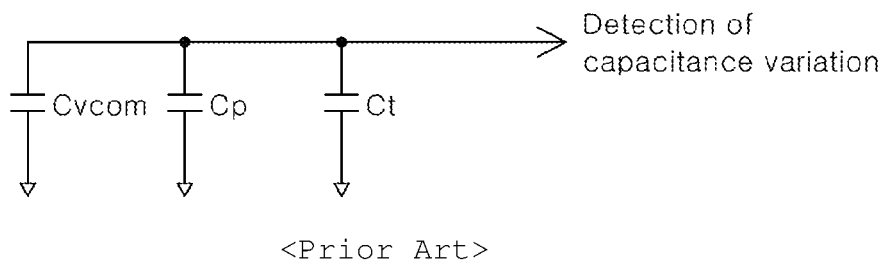
<Prior Art>
[FIG. 5]
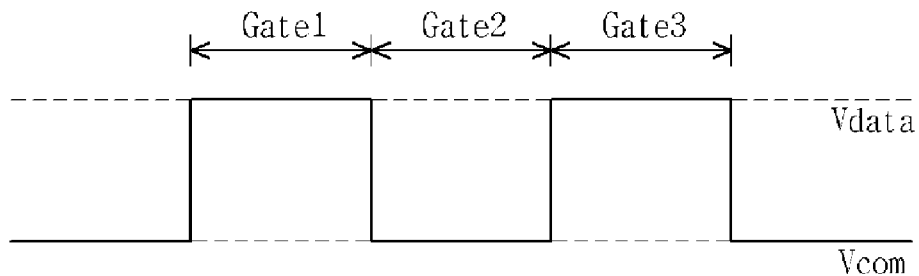

[FIG. 6]
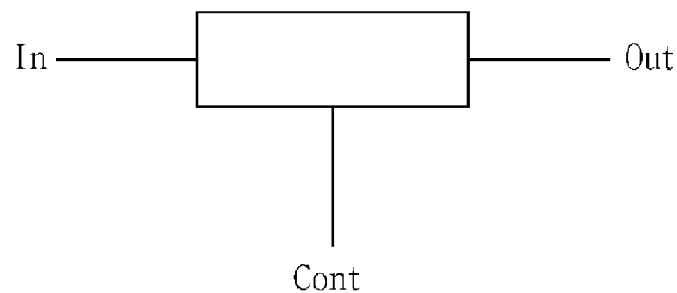
[FIG. 7]
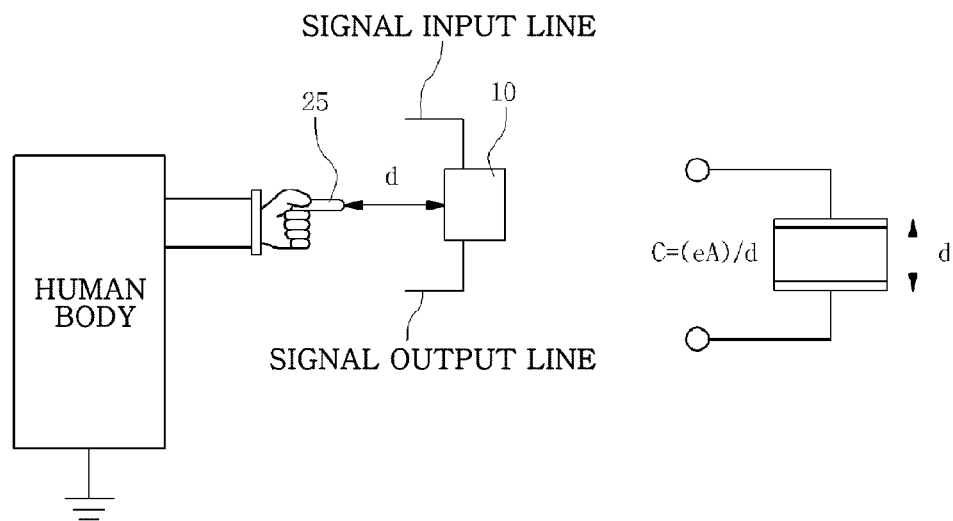

[FIG. 8]
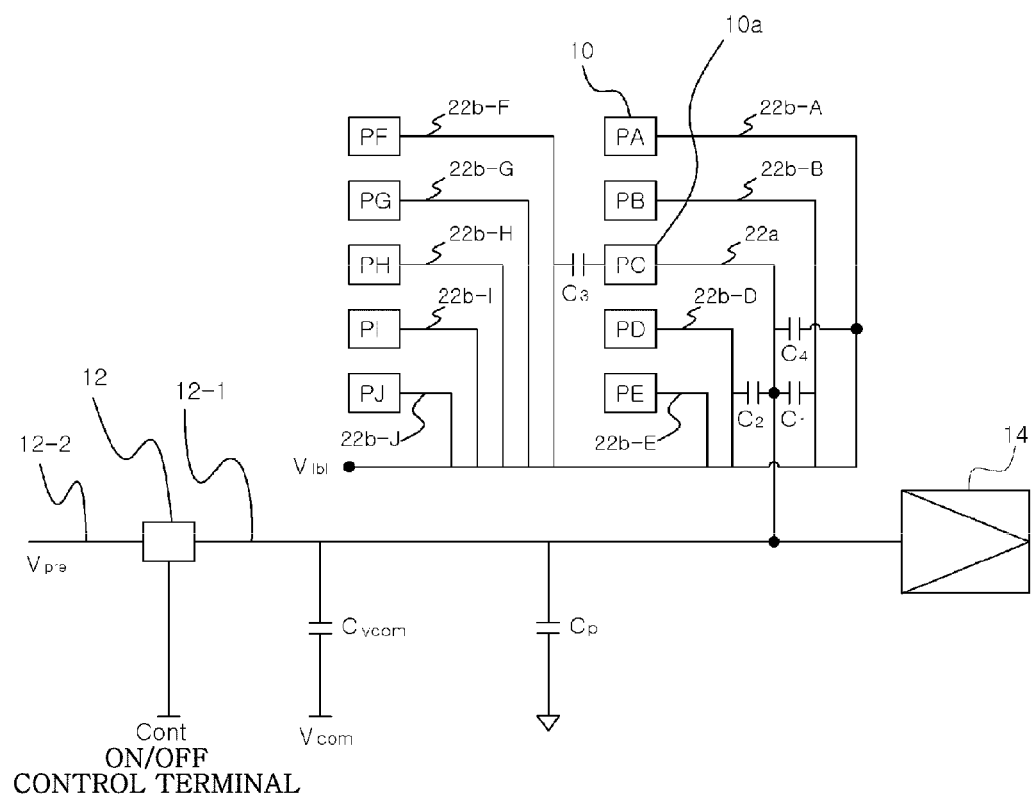

[FIG. 9]
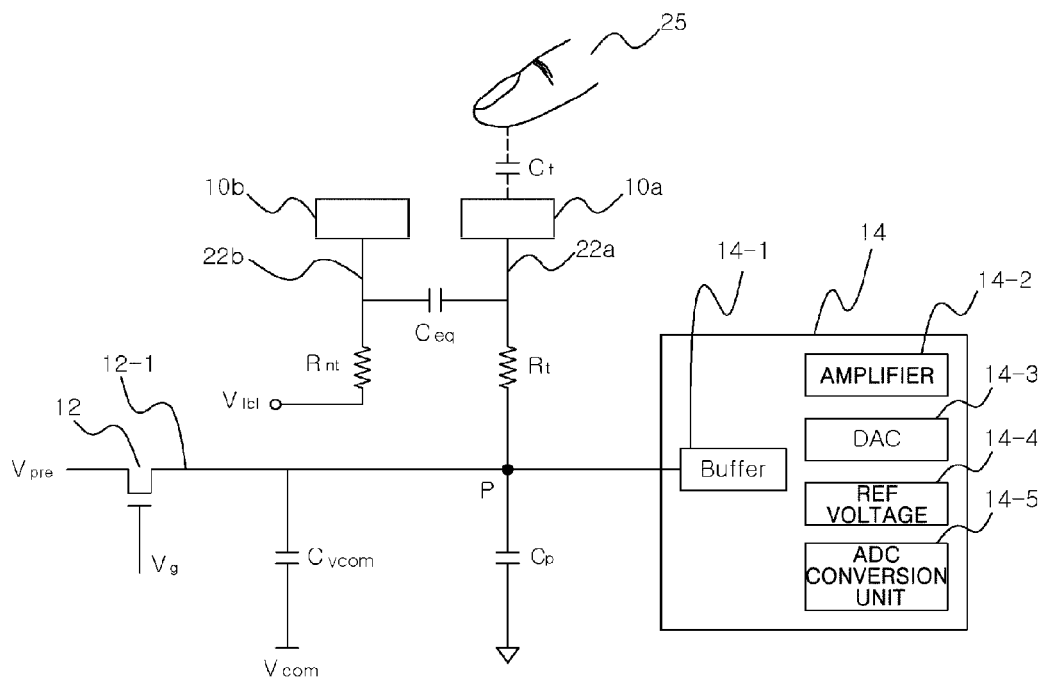
[FIG. 10]
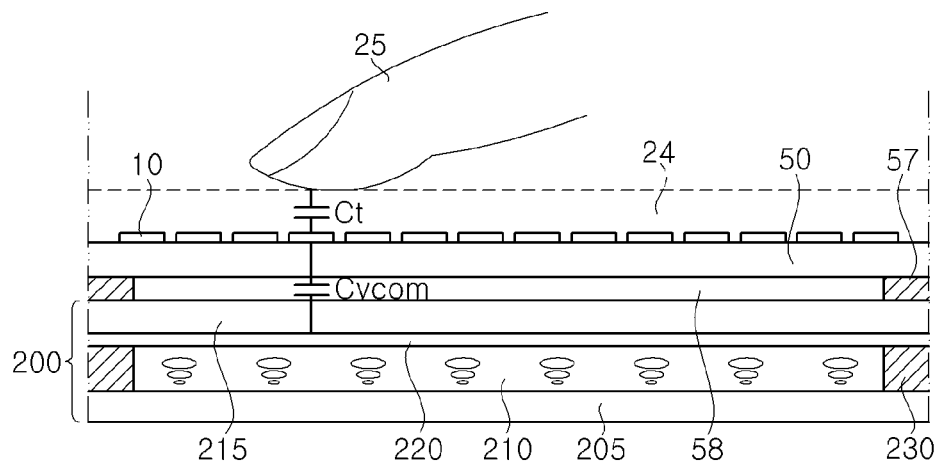

[FIG. 11]
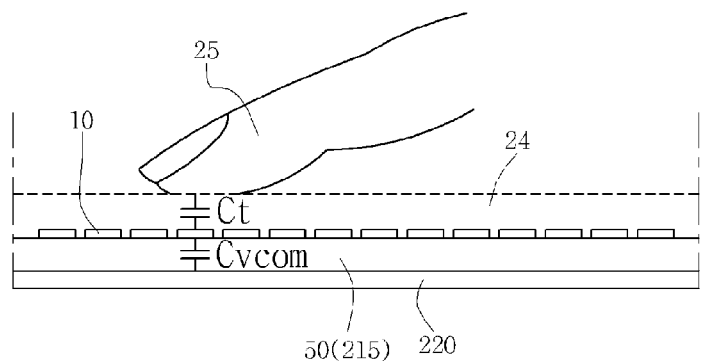
[FIG. 12]
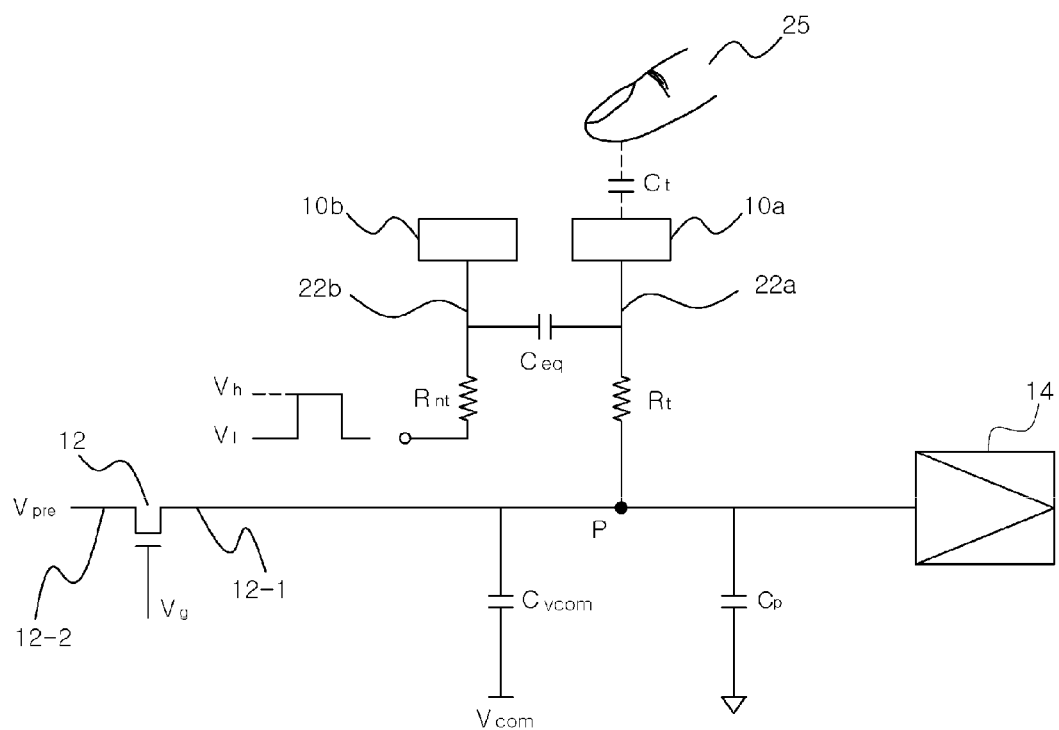

[FIG. 13]
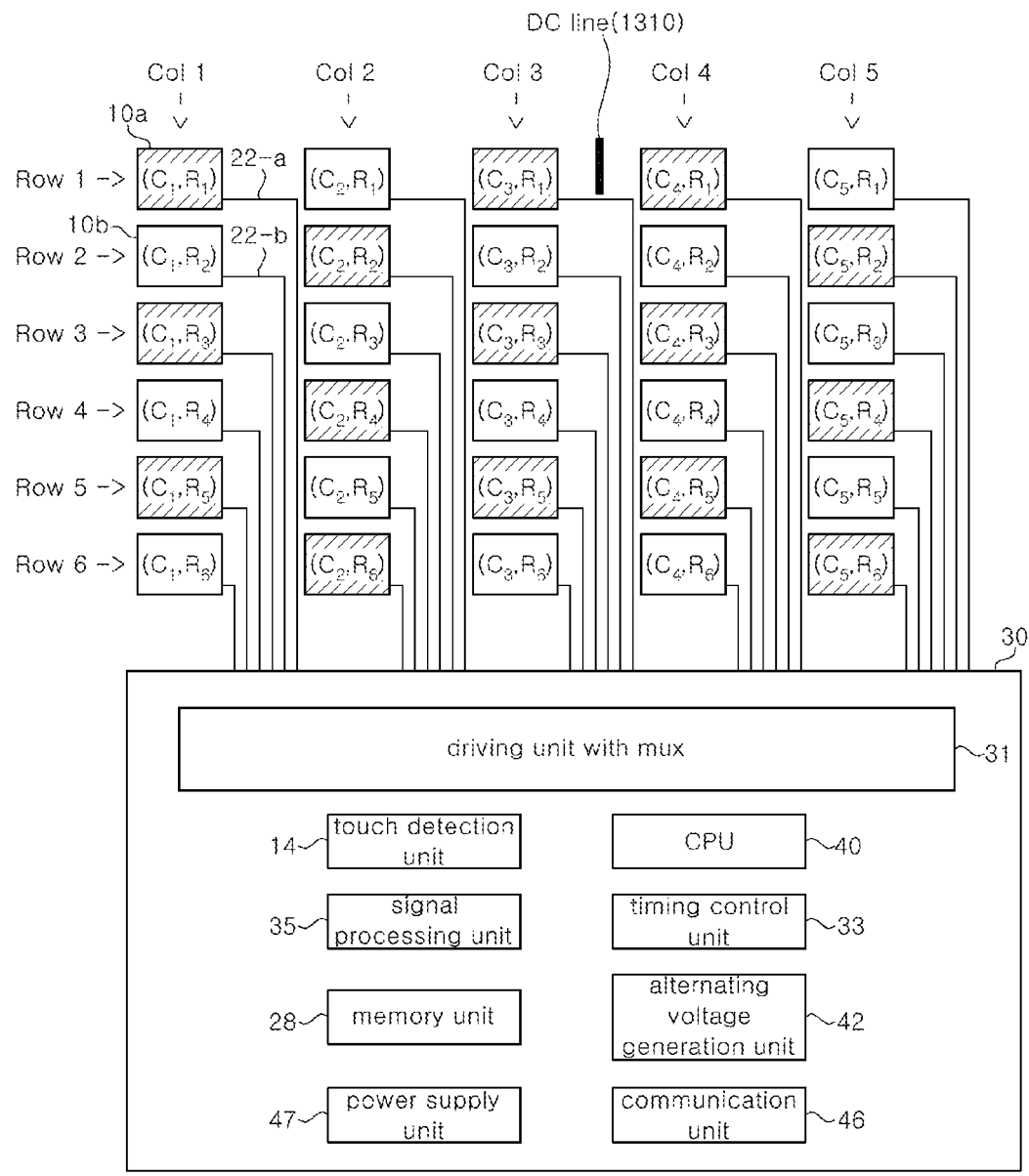

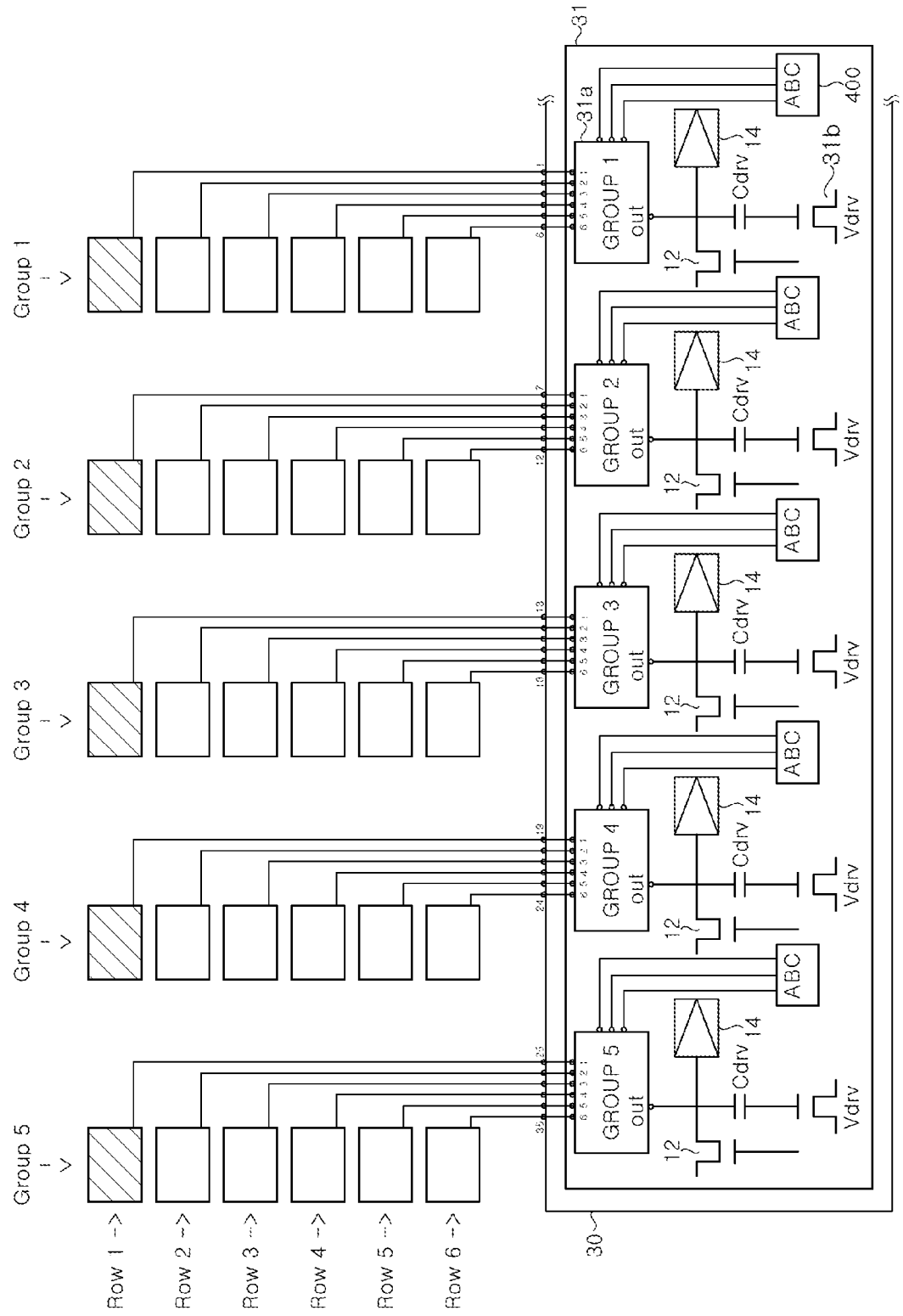
[FIG. 14]

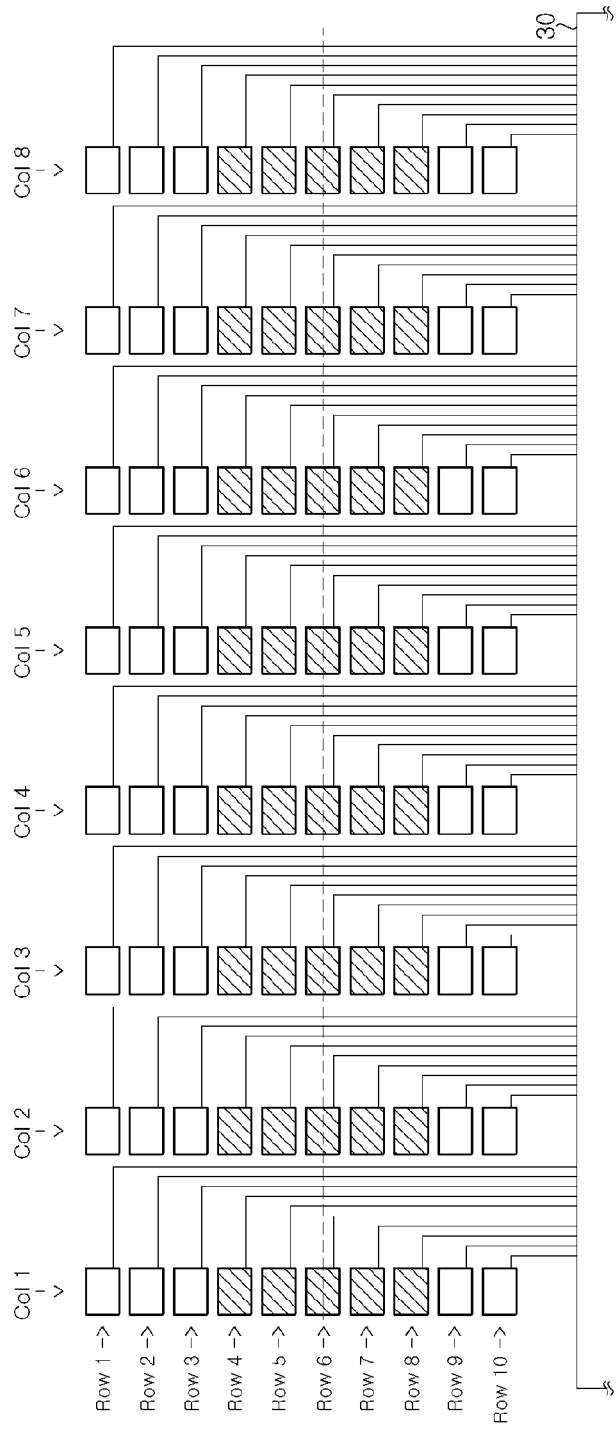
[FIG. 15]

[FIG. 16]
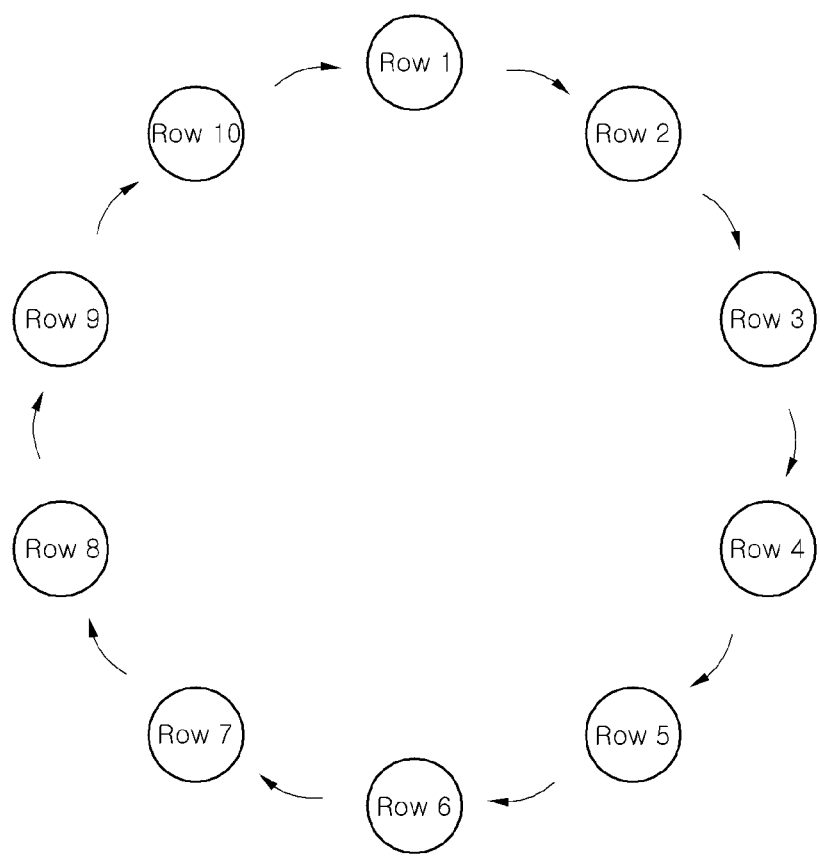

[FIG. 17]
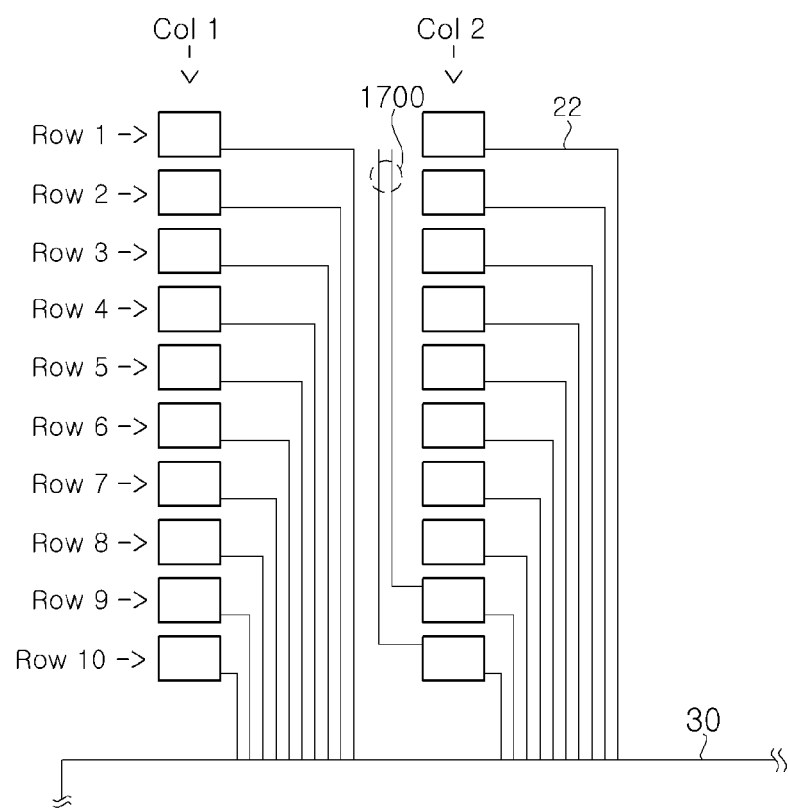

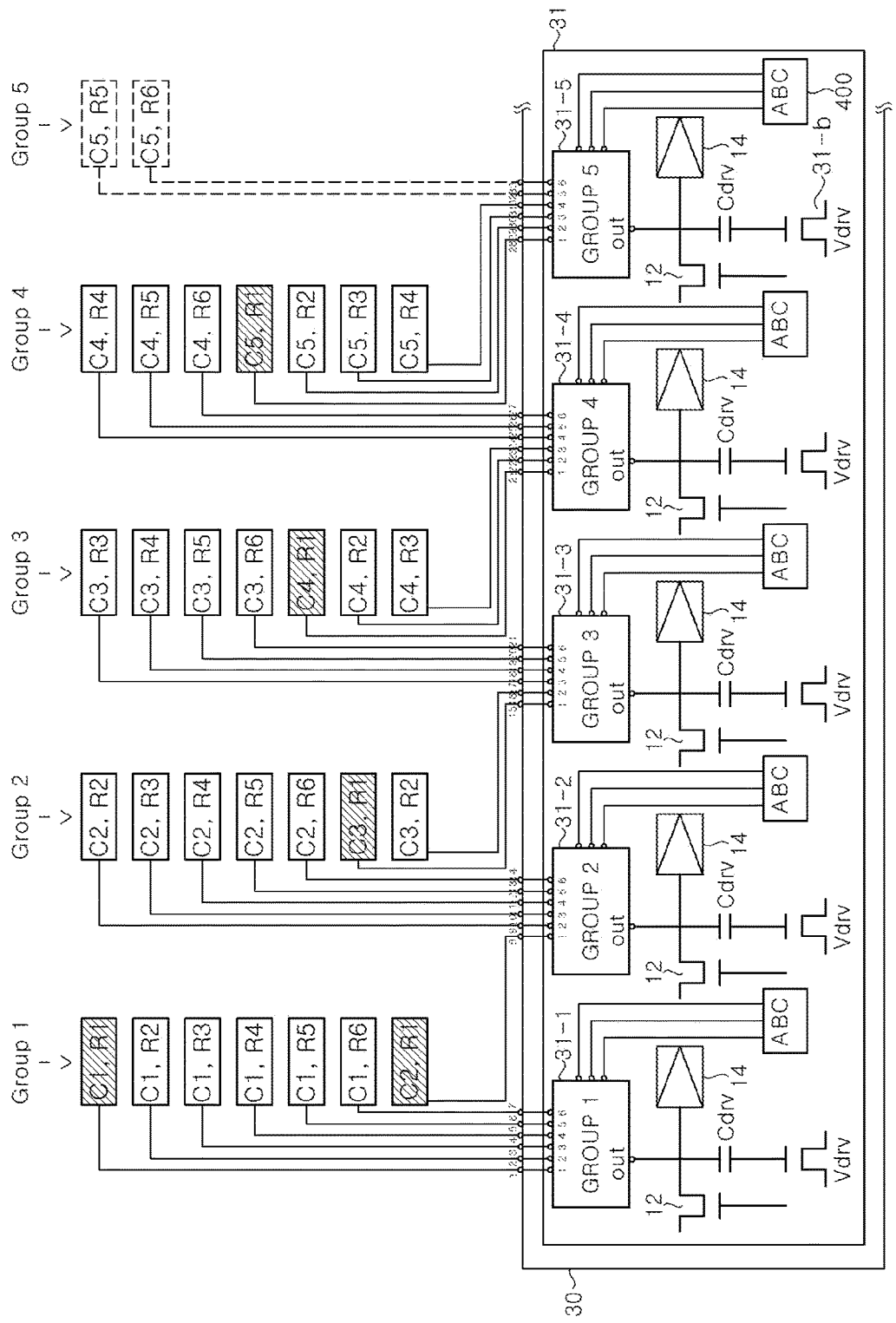
[FIG. 18]

[FIG. 19]

| C1, R1 | C2, R2 | C3, R3 | C4, R4 |
|--------|--------|--------|--------|
| C1, R2 | C2, R3 | C3, R4 | C4, R5 |
| C1, R3 | C2, R4 | C3, R5 | C4, R6 |
| C1, R4 | C2, R5 | C3, R6 | C5, R1 |
| C1, R5 | C2, R6 | C4, R1 | C5, R2 |
| C1, R6 | C3, R1 | C4, R2 | C5, R3 |
| C2, R1 | C3, R2 | C4, R3 | C5, R4 |

[FIG. 20]

| C1, R1 | C2, R1 | C3, R1 | C4, R1 | C5, R1 |
|--------|--------|--------|--------|--------|
| C1, R2 | C2, R2 | C3, R2 | C4, R2 | C5, R2 |
| C1, R3 | C2, R3 | C3, R3 | C4, R3 | C5, R3 |
| C1, R4 | C2, R4 | C3, R4 | C4, R4 | C5, R4 |
| C1, R5 | C2, R5 | C3, R5 | C4, R5 | C5, R5 |
| C1, R6 | C2, R6 | C3, R6 | C4, R6 | C5, R6 |

DEVICE AND METHOD FOR DETECTING CAPACITIVE TOUCH SIGNAL

CROSS REFERENCE PARAGRAPH

This application is a U.S. National Stage of PCT/KR2016/001740, filed Feb. 23, 2016, which claims the priority benefit of Korean Patent Application No. 10-2015-0030825, filed on Mar. 5, 2015 in the Korean Intellectual Property Office, the disclosures of which are incorporated herein by reference.

TECHNICAL FIELD

The present invention relates to a device and a method for detecting a capacitive touch signal of a finger of a human body or a touch input means having similar conductive properties to the finger, and more particularly, to a device and a method for detecting a capacitive touch signal, which detect a touch signal by using a sensing equivalent capacitor formed between a sensing pad and a non-sensing pad.

BACKGROUND ART

In general, a touch screen panel which is attached onto display devices including a liquid crystal display (LCD), a plasma display panel (PDP), an organic light emitting diode (OLED), an active matrix organic light emitting diode (AMOLED), and the like is one of input devices which generate a signal corresponding to a relevant location when an object such as a finger or pen is touched. The touch screen panel is used in very wide fields including a small portable terminal, an industrial terminal, a digital information device (DID), and the like. Various types of touch screen panels in the related art are disclosed, but a resistive touch screen panel in which a manufacturing process is simple and manufacturing cost is small is most widely used. However, the resistive touch screen panel has problems in that it is inconvenient to use the resistive touch screen panel, multi-touch and gesture recognition are difficult, and a detection error occurs because transmittance is low and pressure needs to be applied.

Contrary to this, since the capacitive touch screen panel has advantages in that the transmittance is high, soft touch may be recognized, and the multi-touch and the gesture recognition are excellent, the capacitive touch screen panel is increasingly penetrating a market.

FIG. 1 illustrates one example of a capacitive touch screen panel in the related art. Referring to FIG. 1, transparent conductive films are formed on upper and lower surfaces of a transparent substrate 2 made of plastic or glass and voltages applying metallic electrodes 4 are formed at four respective corners of the transparent substrate 2. The transparent conductive film is made of transparent metal such as indium tin oxide (ITO) or antimony tin oxide (ATO). In addition, the metallic electrodes 4 formed at four corners of the transparent conductive film are formed by being printed with conductive metal having low resistivity, such as silver (Ag). A resistance network is formed on the periphery of the metallic electrodes 4. The resistance network is formed with a linearization pattern in order to uniformly transmit a control signal to the entire surface of the transparent conductive film. In addition, a passivation film is coated on the top of the transparent conductive film including the metallic electrode 4.

In the capacitive touch screen panel, when high-frequency alternating voltage is applied to the metallic electrode 4, the high-frequency alternating voltage spreads over a front surface of the transparent substrate 2. In this case, when the transparent conductive film on the top of the transparent substrate 2 is lightly touched with a finger 8 or a conductive touch input means, a current sensor embedded in a controller 6 senses a change in current while a predetermined amount of current is absorbed in a body and a current amount is calculated in each of four metallic electrodes 4 to recognize a touch point.

However, since a capacitive touch screen panel illustrated in FIG. 1 as a type that detects a magnitude of micro current requires an expensive detection device, there is a problem in that price increases and the multi-touch of recognizing a plurality of touches is difficult.

In order to solve the problem, a capacitive touch screen panel illustrated in FIG. 2 has been primarily used in recent years. The touch screen panel of FIG. 2 is constituted by a horizontal linear touch detection sensor 5a and a vertical linear touch detection sensor 5b, and a touch drive IC 7 analyzing a touch signal. Since the touch screen panel as a type that detects a magnitude of capacitance formed between the linear touch detection sensor 5 and the finger 8 detects a signal by scanning the horizontal linear touch detection sensor 5a and the vertical linear touch detection sensor 5b, a plurality of touch points may be recognized in the touch screen panel.

However, when such a touch screen panel is used while being mounted on a display device such as an LCD, a phenomenon occurs in which it is difficult to detect the signal by noise. For example, the LCD uses a common electrode and in some cases, alternative common voltage Vcom is applied to the common electrode. In addition, the common voltage Vcom of the common electrode serves as the noise when the touch point is detected.

FIG. 3 illustrates an embodiment in which the capacitive touch screen panel in the related art is installed on an LCD. A display device 200 has a structure in which a liquid crystal is enclosed between a TFT substrate 205 at a lower side and a color filter 215 at an upper side to form a liquid crystal layer 210. The TFT substrate 205 and the color filer 215 are bonded to each other by a sealant 230 at outer portions thereof in order to enclose the liquid crystal. Although not illustrated, polarizers are attached to upper and lower sides of a liquid crystal panel and besides, a back light unit (BLU) is installed.

The touch screen panel is installed in an upper portion of the display device 200 as illustrated in FIG. 3. The touch screen panel has a structure in which the linear touch detection sensor 5 is mounted on the top of a substrate 1. A protection panel 3 for protecting the linear touch detection sensor 5 is attached onto the substrate 1. The touch screen panel is bonded to an edge portion of the display device 200 via a bonding member 9 such as a double adhesive tape (DAT), and forms an air gap 9a from the display device 200.

In such a structure, when the touch illustrated in FIG. 3 is generated, capacitance such as Ct is formed between the finger 8 and the linear touch detection sensor 5. However, as illustrated in FIG. 3, capacitance such as common electrode capacitance Cvcom is formed even between the linear touch detection sensor 5 and a common electrode 220 formed on the bottom of the color filter 215 of the display device 200 and Cp which is unknown parasitic capacitance by a capacitance coupling or manufacturing process factor between patterns also acts on the linear touch detection sensor 5. Therefore, a circuit such as an equivalent circuit of FIG. 4 is configured.

Herein, in the touch screen panel in the related art, the touch is recognized by detecting a change amount of Ct which is touch capacitance and components including Cvcom and Cp serve as the noise at the time of detecting Ct. In particular, since the common electrode capacitance Cvcom generated between the pattern and the display device may be ten times or more larger than Ct which is the touch capacitance, there is a problem in that touch sensitivity deteriorates due to Cvcom.

DISCLOSURE

Technical Problem

The present invention is proposed to solve the problem of the touch screen panel in the related art and an object of the present invention is to provide a means and a method for detecting a capacitive touch, which minimize an influence by parasitic capacitance and stably acquire a touch signal by acquiring the touch signal by using a phenomenon in which there is a difference in magnitude of voltage detected by a touch detection unit according to the magnitude of touch capacitance when alternative driving voltage is applied to one side of a sensing equivalent capacitor which is formed between a sensing pad connected to the touch detection unit and a non-sensing pad adjacent to the sensing pad and operates as a parasitic capacitor in the related art and the touch capacitance is formed between a touch input means such as a finger and the sensing pad.

Technical Solution

According to an aspect of a device for detecting a capacitive touch signal, a device for detecting a capacitive touch signal, which detects whether a touch input means such as a finger of a human body or a conductor similar thereto is touched in a touch panel including a plurality of touch detection sensors in a matrix form, includes: a touch drive IC (TDI) detecting whether a touch occurs by approach of the touch input means, and the touch drive IC determines whether the touch occurs by using at least one sensing equivalent capacitor Ceq formed between at least one sensing pad and at least one non-sensing pad among the touch detection sensors.

Preferably, the sensing pad is a pad in which the touch is detected by the touch drive IC at a first time and the non-sensing pad is a pad in which the touch is not detected by the touch drive IC at the first time, and the sensing pad and the non-sensing pad vary according to the time.

Preferably, the sensing equivalent capacitor Ceq is a plurality of line-to-line capacitors generated between a sensing pad signal line connecting the sensing pad and the touch drive IC and a non-sensing pad signal line connecting the non-sensing pad and the touch drive IC.

Preferably, a magnitude of the sensing equivalent capacitor is determined by charging the sensing pad with first voltage and applying second voltage to the non-sensing pad.

Preferably, the first voltage and the second voltage are direct current (DC) voltage or alternating voltage or a combination type of the DC voltage and the alternating voltage and the first voltage and the second voltage have different potentials to generate a potential difference.

Preferably, the second voltage is applied to all of the non-sensing pads other than the sensing pad to operate the touch panel in a full driving state.

Preferably, some of the non-sensing pads are connected to the second voltage and some of the non-sensing pads are connected to DC power or maintain a floating state to operate the touch panel in a block driving state.

Preferably, the touch detection in the touch drive IC is performed by a difference between voltage $Vsensor_{touch}$ when a touch capacitance Ct is generated by approaching of the touch input means for the touch detection sensor and voltage $Vsensor_{nontouch}$ when the touch capacitance is not generated.

Preferably, the voltage $Vsensor_{touch}$ when the touch capacitance Ct is generated by approaching of the touch input means for the touch detection sensor and voltage $Vsensor_{nontouch}$ when the touch capacitance is not generated are in proportion to the magnitude of the sensing equivalent capacitor.

Preferably, the voltage $Vsensor_{touch}$ when the touch capacitance Ct is generated by approaching of the touch input means for the touch detection sensor is in inverse proportion to the magnitude of the touch capacitance Ct.

Preferably, the second voltage is the alternating voltage and whether the touch occurs in the touch drive IC is detected in synchronization with a time (falling time (Ft)) in which a high level of the second voltage falls to a low level.

Preferably, in the touch drive IC, when the voltage $Vsensor_{touch}$ when the touch capacitance Ct is generated by approaching of the touch input means for the touch detection sensor is acquired, the magnitude of the first voltage is larger than the magnitude of the second voltage or larger than a difference between a high value of the second voltage and a low value of the second voltage.

Preferably, in the touch drive IC, when the voltage $Vsensor_{nontouch}$ when the touch capacitance is not generated is acquired, the magnitude of the first voltage is larger than the magnitude of the second voltage or larger than the difference between the high value of the second voltage and the low value of the second voltage.

Preferably, the first voltage and the second voltage are the alternating voltage and the first voltage and the second voltage have inverse phases.

Preferably, all of the non-sensing pads other than the sensing pad maintain the DC potential or the floating state and the DC potential includes zero (0) V.

Preferably, the sensing pad is a plurality of touch detection sensors positioned in row [j].

Herein, row [j] maintains a relationship of row [1]≤row [j]≤row [m], and row [1] represents a first row where touch detection sensors positioned most distant from the touch drive IC are positioned and row [m] represents an m-th row where touch detection sensors positioned shortest from the touch drive IC are positioned.

Preferably, the sensing pad is the plurality of touch detection sensors positioned in row [j], and the non-sensing pad is a plurality of touch detection sensors positioned in at least one row positioned between row [1] and row [j−1] or a plurality of touch detection sensors positioned in at least one row positioned between row [j+1] and row [m].

Herein, row [j] maintains the relationship of row [1]≤row [j]≤row [m], and row [1] represents the first row where touch detection sensors positioned most distant from the touch drive IC are positioned and row [m] represents the m-th row where touch detection sensors positioned shortest from the touch drive IC are positioned.

Preferably, some of the touch detection sensors positioned in row [j] include sensing-non-sensing pads, and the sensing-non-sensing pad is a non-sensing pad positioned in row [j].

Preferably, the sensing pad and the non-sensing pad vary by the unit of the row.

Preferably, the device further includes: a means for determining the number of rows of the non-sensing pads; and a means for determining locations where the non-sensing pads are present.

Preferably, the touch detection sensors positioned in row [j] are scanned while being divided into a plurality of subsets and the subset includes at least one touch detection sensor.

Preferably, the subset is constituted by a first subset including touch detection sensors of even columns and a plurality of second subsets including touch detection sensors of odd columns.

Preferably, the subset is constituted by two subsets, and the first subset is touch detection sensors positioned at a left side of a central column and the second subset is touch detection sensors positioned in the central column.

Preferably, some of the touch detection sensors positioned in row [j] include sensing-non-sensing pads, the sensing-non-sensing pad is the non-sensing pad positioned in row [j], and the second voltage applied to the non-sensing pad is alternating voltage and the alternating voltage applied to the sensing-non-sensing pad has an inverse phase to the second voltage.

Preferably, the alternating voltage having the inverse phase from the second voltage is applied only to some of the sensing-non-sensing pads.

Preferably, the second voltage is the alternating voltage and the non-sensing pads positioned in at least one row of row [1] to row [j−1] and row [j+1] to row [m] are classified into a first group having a first phase and a second group having an inverse phase to the first phase.

Preferably, the phase of the alternating voltage of the second voltage applied to the non-sensing pad positioned in row [j−1] and the non-sensing pad positioned in row [j+1] and the phase of the alternating voltage of the second voltage applied to the non-sensing pad positioned in row [1] to row [j−2] and the non-sensing pad positioned in row [j+2] and row [m] maintain the inverse phase relationship.

Preferably, the non-sensing pad is a plurality of touch detection sensors positioned in row [j−1] and row [j+1] and the second voltage applied to the non-sensing pad is the alternating voltage.

Preferably, all of the touch detection sensors other than the sensing pad and the non-sensing pad maintain the DC potential or the floating state and the DC potential includes zero (0) V or a ground.

Preferably, when the sensing pad and the non-sensing pad vary by the unit of the row, if the sensing pad is the plurality of touch detection sensors positioned in row [1], the non-sensing pads are a plurality of touch detection sensors positioned between row [2] and row [m].

Preferably, when the non-sensing pad is determined as one row in each of the front and the rear of row [1] where the sensing pad is positioned, the rows where the non-sensing pads are positioned are row [2] and row [m], respectively.

Preferably, when the non-sensing pad is determined as a plurality of rows in the front and the rear of row [1] where the sensing pad is positioned, the front row refers to a plurality of rows positioned between the row positioned at the center and row [m] and the rear row refers to a plurality of rows positioned between row [2] and the row positioned at the center.

Preferably, when the sensing pad and the non-sensing pad vary by the unit of the row, if the sensing pad is the plurality of touch detection sensors positioned in row [m], the non-sensing pad is a plurality of touch detection sensors positioned between row [1] and row [m−1].

Preferably, when the non-sensing pad is set as one row in each of the front and the rear of row [m] where the sensing pad is positioned, the rows where the non-sensing pads are positioned are row [m−1] and row [1], respectively.

Preferably, when the non-sensing pad is determined as a plurality of rows in the front and the rear of row [m] where the sensing pad is positioned, the front row refers to a plurality of rows positioned between the row positioned at the center and row [m−1] and the rear row refers to a plurality of rows positioned between row [1] and the row positioned at the center.

Preferably, when the sensing pad is the plurality of touch detection sensors positioned in row [1], the sensing equivalent capacitor includes a line-to-line capacitance with a plurality of sensor signal lines connected to a plurality of touch detection sensors positioned in a second column which is a next column of a first column where the sensing pad is positioned.

Preferably, the sensor signal lines of the touch detection sensors positioned in the second column are formed at the left side and the right side of the touch detection sensor of the second column.

Preferably, the sensor signal line formed at the right side is connected with the touch drive IC and the sensor signal line formed at the left side is disposed while being spaced apart from the sensor signal line of row [1] of the first column by a predetermined interval, and as a result, the second voltage is applied to the sensor signal line.

According to an aspect of a method for detecting a capacitive touch signal, a method for detecting a capacitive touch signal, which detects whether a touch input means such as a finger of a human body or a conductor similar thereto is touched in a touch panel including a plurality of touch detection sensors in a matrix form, includes: charging at least one sensing pad among the touch detection sensors with first voltage; applying at least one non-sensing pad among the touch detection sensors with second voltage; and detecting whether a touch occurs by approaching of the touch input means by using at least one sensing equivalent capacitor Ceq formed between the sensing pad and the non-sensing pad in a touch drive IC (TDI).

Preferably, the sensing pad is a pad in which the touch is detected by the touch drive IC at a first time and the non-sensing pad is a pad in which the touch is not detected by the touch drive IC at the first time, and the sensing pad and the non-sensing pad vary according to the time.

Preferably, the sensing equivalent capacitor Ceq is a plurality of line-to-line capacitors generated between a sensing pad signal line connecting the sensing pad and the touch drive IC and a non-sensing pad signal line connecting the non-sensing pad and the touch drive IC.

Preferably, a magnitude of the sensing equivalent capacitor is determined by charging the sensing pad with first voltage and applying second voltage to the non-sensing pad.

Preferably, the first voltage and the second voltage are direct current (DC) voltage or alternating voltage or a combination type of the DC voltage and the alternating voltage and the first voltage and the second voltage have different potentials to generate a potential difference.

Preferably, the second voltage is applied to all of the non-sensing pads other than the sensing pad to operate the touch panel in a full driving state.

Preferably, some of the non-sensing pads are connected to the second voltage and some of the non-sensing pads are connected to DC power or maintain a floating state to operate the touch panel in a block driving state.

Preferably, the touch detection in the touch drive IC is performed by a difference between voltage $Vsensor_{touch}$ when a touch capacitance Ct is generated by approaching of the touch input means for the touch detection sensor and voltage $Vsensor_{nontouch}$ when the touch capacitance is not generated.

Preferably, the voltage $Vsensor_{touch}$ when the touch capacitance Ct is generated by approaching of the touch input means for the touch detection sensor and voltage $Vsensor_{nontouch}$ when the touch capacitance is not generated are in proportion to the magnitude of the sensing equivalent capacitor.

Preferably, the voltage $Vsensor_{touch}$ when the touch capacitance Ct is generated by approaching of the touch input means for the touch detection sensor is in inverse proportion to the magnitude of the touch capacitance Ct.

Preferably, the second voltage is the alternating voltage and whether the touch occurs in the touch drive IC is detected in synchronization with a time (falling time (Ft)) in which a high level of the second voltage falls to a low level.

Preferably, in the touch drive IC, when the voltage $Vsensor_{touch}$ when the touch capacitance Ct is generated by approaching of the touch input means for the touch detection sensor is acquired, the magnitude of the first voltage is larger than the magnitude of the second voltage or larger than a difference between a high value of the second voltage and a low value of the second voltage.

Preferably, in the touch drive IC, when the voltage $Vsensor_{nontouch}$ when the touch capacitance is not generated is acquired, the magnitude of the first voltage is larger than the magnitude of the second voltage or larger than the difference between the high value of the second voltage and the low value of the second voltage.

Preferably, the first voltage and the second voltage are the alternating voltage and the first voltage and the second voltage have inverse phases.

Preferably, all of the non-sensing pads other than the sensing pad maintain the DC potential or the floating state and the DC potential includes zero (0) V.

Preferably, the sensing pad is a plurality of touch detection sensors positioned in row [j].

Herein, row [j] maintains the relationship of row [1]≤row [j]≤row [m], and row [1] represents the first row where touch detection sensors positioned most distant from the touch drive IC are positioned and row [m] represents the m-th row where touch detection sensors positioned shortest from the touch drive IC are positioned.

Preferably, the sensing pad is the plurality of touch detection sensors positioned in row [j], and the non-sensing pad is a plurality of touch detection sensors positioned in at least one row positioned between row [1] and row [j−1] or a plurality of touch detection sensors positioned in at least one row positioned between row [j+1] and row [m].

Herein, row [j] maintains the relationship of row [1]≤row [j]≤row [m], and row [1] represents the first row where touch detection sensors positioned most distant from the touch drive IC are positioned and row [m] represents the m-th row where touch detection sensors positioned shortest from the touch drive IC are positioned.

Preferably, some of the touch detection sensors positioned in row [j] include sensing-non-sensing pads, and the sensing-non-sensing pad is a non-sensing pad positioned in row [j].

Preferably, the sensing pad and the non-sensing pad vary by the unit of the row.

Preferably, the device further includes: a means for determining the number of rows of the non-sensing pads; and a means for determining locations where the non-sensing pads are present.

Preferably, the touch detection sensors positioned in row [j] are scanned while being divided into a plurality of subsets and the subset includes at least one touch detection sensor.

Preferably, the subset is constituted by a first subset including touch detection sensors of even columns and a plurality of second subsets including touch detection sensors of odd columns.

Preferably, the subset is constituted by two subsets, and the first subset is touch detection sensors positioned at a left side of a central column and the second subset is touch detection sensors positioned in the central column.

Preferably, some of the touch detection sensors positioned in row [j] include sensing-non-sensing pads, the sensing-non-sensing pad is the non-sensing pad positioned in row [j], and the second voltage applied to the non-sensing pad is alternating voltage and the alternating voltage applied to the sensing-non-sensing pad has an inverse phase to the second voltage.

Preferably, the alternating voltage having the inverse phase from the second voltage is applied only to some of the sensing-non-sensing pads.

Preferably, the second voltage is the alternating voltage and the non-sensing pads positioned in at least one row of row [1] to row [j−1] and row [j+1] to row [m] are classified into a first group having a first phase and a second group having an inverse phase to the first phase.

Preferably, the phase of the alternating voltage of the second voltage applied to the non-sensing pad positioned in row [j−1] and the non-sensing pad positioned in row [j+1] and the phase of the alternating voltage of the second voltage applied to the non-sensing pad positioned in row [1] to row [j−2] and the non-sensing pad positioned in row [j+2] and row [m] maintain the inverse phase relationship.

Preferably, the non-sensing pad is a plurality of touch detection sensors positioned in row [j−1] and row [j+1] and the second voltage applied to the non-sensing pad is the alternating voltage.

Preferably, all of the touch detection sensors other than the sensing pad and the non-sensing pad maintain the DC potential or the floating state and the DC potential includes zero (0) V or a ground.

Preferably, when the sensing pad and the non-sensing pad vary by the unit of the row, if the sensing pad is the plurality of touch detection sensors positioned in row [1], the non-sensing pads are a plurality of touch detection sensors positioned between row [2] and row [m].

Preferably, when the non-sensing pad is determined as one row in each of the front and the rear of row [1] where the sensing pad is positioned, the rows where the non-sensing pads are positioned are row [2] and row [m], respectively.

Preferably, when the non-sensing pad is determined as a plurality of rows in the front and the rear of row [1] where the sensing pad is positioned, the front row refers to a plurality of rows positioned between the row positioned at the center and row [m] and the rear row refers to a plurality of rows positioned between row [2] and the row positioned at the center.

Preferably, when the sensing pad and the non-sensing pad vary by the unit of the row, if the sensing pad is the plurality of touch detection sensors positioned in row [m], the non-sensing pad is a plurality of touch detection sensors positioned between row [1] and row [m−1].

Preferably, when the non-sensing pad is set as one row in each of the front and the rear of row [m] where the sensing pad is positioned, the rows where the non-sensing pads are positioned are row [m−1] and row [1], respectively.

Preferably, when the non-sensing pad is determined as a plurality of rows in the front and the rear of row [m] where the sensing pad is positioned, the front row refers to a plurality of rows positioned between the row positioned at the center and row [m−1] and the rear row refers to a plurality of rows positioned between row [1] and the row positioned at the center.

Preferably, when the sensing pad is the plurality of touch detection sensors positioned in row [1], the sensing equivalent capacitor includes a line-to-line capacitance with a plurality of sensor signal lines connected to a plurality of touch detection sensors positioned in a second column which is a next column of a first column where the sensing pad is positioned.

Preferably, the sensor signal lines of the touch detection sensors positioned in the second column are formed at the left side and the right side of the touch detection sensor of the second column.

Preferably, the sensor signal line formed at the right side is connected with the touch drive IC and the sensor signal line formed at the left side is disposed while being spaced apart from the sensor signal line of row [1] of the first column by a predetermined interval, and as a result, the second voltage is applied to the sensor signal line.

Advantageous Effects

According to a device and a method for detecting a capacitive touch signal of the present invention, alternative driving voltage is applied to a sensing equivalent capacitor which is formed between a sensing pad and a non-sensing pad adjacent to the sensing pad and a touch signal is acquired by detecting that there is a difference in voltage in a touch detection unit by a difference in touch capacitance applied by a touch input such as a finger to reversely use parasitic capacitance generated between sensor signal lines serving as noise in the related art as a mean for detecting the touch signal.

According to the device and the method for detecting a capacitive touch signal of the present invention, a sensitivity of the touch signal can be controlled by controlling the magnitude of the driving voltage applied to the sensing equivalent capacitor.

DESCRIPTION OF DRAWINGS

FIG. 1 is a diagram illustrating a perspective view of one example of a touch screen panel in the related art.

FIG. 2 is a diagram illustrating a plan view of another example of the touch screen panel in the related art.

FIG. 3 is a diagram illustrating a cross-sectional view of an example in which the touch screen panel of FIG. 2 is installed on a display device.

FIG. 4 is a diagram illustrating an equivalent circuit diagram of detecting touch capacitance in the touch screen panel of FIG. 3.

FIG. 5 is a diagram illustrating a waveform diagram illustrating a common voltage waveform of a liquid crystal display device.

FIG. 6 is a diagram conceptually illustrating a normal 3-terminal type switching element.

FIG. 7 is a diagram schematically illustrating a principle of detecting a touch input.

FIG. 8 is a diagram illustrating a basic circuit diagram of a touch detecting device according to the present invention.

FIG. 9 is a diagram more specifically illustrating an equivalent circuit of FIG. 8.

FIG. 10 is a diagram illustrating a cross-sectional view of one example of a touch detection sensor configuration according to the present invention.

FIG. 11 is a diagram illustrating a cross-sectional view of another example of the touch detection sensor configuration according to the present invention.

FIG. 12 is a diagram illustrating an embodiment of applying alternating voltage to a sensing equivalent capacitor between a sensing pad signal line and a non-sensing pad signal line according to the present invention.

FIG. 13 is a diagram schematically illustrating a configuration diagram of a device for detecting a capacitive touch signal according to the present invention.

FIG. 14 is a diagram illustrating an embodiment in which the device for detecting a capacitive touch signal is configured to include a multiplexer according to the present invention.

FIG. 15 is a diagram for describing an embodiment of block driving according to the present invention.

FIG. 16 is a diagram for describing another embodiment (rotation function) of the block driving according to the present invention.

FIG. 17 is a diagram illustrating an embodiment of the touch screen panel according to the present invention.

FIG. 18 is a diagram illustrating another embodiment (remapping) of the device for detecting a capacitive touch signal according to the present invention.

FIG. 19 is a diagram illustrating a remapping process of FIG. 18.

FIG. 20 is a diagram illustrating a result of remapping, which is stored in a memory storage device according to the present invention.

BEST MODE

Hereinafter, preferred embodiments of the present invention will be described in detail with reference to the accompanying drawings and embodiments.

First, the present invention relates to a method for detecting a capacitive touch signal and relates to a method that detects a touch by using a phenomenon in which there is a difference in detection voltage by a difference in magnitude of added touch capacitance at the time of applying alternating driving voltage to a sensing equivalent capacitor formed between a sensing pad which is detecting the touch and an adjacent non-sensing pad unlike a case where a touch detection means is a type that detects a magnitude of capacitance by contact of a finger, etc.

The sensing equivalent capacitor in the present invention represents a capacitor formed between the sensing pad and the adjacent non-sensing pad and accurately, a line-to-line equivalent capacitor formed between a signal line connected with the sensing pad and the signal connected with the non-sensing pad.

A full driving method in the present invention represents a driving method that applies the alternating driving voltage to all non-sensing pads other than at least one sensing pad to engage in detecting the touch.

A blocking driving method in the present invention as a concept corresponding to the full driving method represents a driving method that applies the alternating driving voltage to only some non-sensing pads, in particular, non-sensing pads adjacent to the sensing pad to engage in detecting the touch.

A touch detecting device according to the present invention compares magnitudes of voltage detected when the touch does not occur and the magnitude of voltage detected when the touch capacitance is added by the occurrence of the touch and detects the touch by a difference between the magnitudes of both voltages to minimize an influence by a parasitic capacitance, etc., and more stably acquire a touch signal.

A display mentioned in the present invention means any one of an LCD, a PDP, and an OLED or all means that displays other images.

Among the display device listed above, the LCD requires a common voltage Vcom in order to drive liquid crystals. As one example, in a medium/small-sized LCD for a portable device, a line inversion method is used, in which the common voltage of a common electrode is alternated in one gate line or for each of a plurality of gate lines. As another example, in a large-sized LCD, a dot inversion driving method is used, in which the common voltage of the common electrode has a predetermined DC level. As yet another example, in the case of an in-plane switching mode LCD, the common electrode is formed in a partial region of an LCD TFT substrate to display the image by the line inversion or dot inversion driving method. In the case of the in-line switching mode LCD, a back ground is commonly formed in all color filters exposed to the outside through bottom ITO and is grounded to a ground signal for ESD blocking.

In the present invention, all electrodes which play a common role in the display device will be referred to as "common electrode" in addition to an electrode to which the common voltage Vcom is applied and the alternating voltage or DC voltage applied to the common electrode of the display device, or a voltage of a type which is alternated at an unspecific frequency will be referred as "common voltage".

In the present invention, a non-contact touch input of the finger or a touch input means having a similar electrical characteristic thereto is detected. Herein, the "non-contact touch input" means that the touch input means such as the finger, etc., performs a touch input while being spaced apart from a touch detection sensor by a predetermined distance by a substrate which is present between an input means and the touch detection sensor. The touch input means may contact an outer surface of the substrate. However, even in this case, the touch input means and the touch detection sensor maintain a non-contact state. Therefore, a touch action of the finger to the touch detection sensor may be expressed as a term "approach". Meanwhile, since the finger may contact the outer surface of the substrate, the touch action of the finger to the substrate may be expressed as a term "contact". In the present specification, the "approach" and the "contact" are commonly used.

Further, components such as "unit" described below are aggregates of unit function elements performing specific functions and for example, an amplifier of a predetermined signal is the unit function element and an aggregate of the amplifiers or signal converters may be referred to as a signal converter. Further, the "unit" may be included a larger component or "unit" or may include smaller components and "units". In addition, the "unit" may autonomously have its own CPU.

In the following drawings, thicknesses or regions of several layers and regions are enlarged for clear expressions.

Throughout the specification, like reference numerals refer to like elements. When it is described that a certain part such as a layer, a region, a substrate, etc., is located "above" or "on the top" another part, it means that the certain part may be located "directly above" on the another part and a third part may be interposed therebetween as well. In contrast, when it is described that a certain part is located "directly above" another part, it means that there is no third part therebetween.

Further, a "signal" disclosed in the present specification collectively refers to voltage or current if not particularly mentioned.

Further, in the present specification, "capacitance" represents a physical size and is used as the same meaning as an "electrostatic capacity". Meanwhile, a "capacitor" refers to an element having the capacitance which is the physical size. In the present invention, a compensated capacitor Cbal may be made by a manufacturing process according to a value designed as made in a touch drive IC and naturally generated like a line-to-line capacitor of the present specification, which is made between two sensor signal lines which are spaced apart from each other by a predetermined distance in parallel. In the present specification, both a directly made capacitor or a naturally formed capacitor are referred to as the "capacitor without distinguishing both capacitors.

In the present specification, C which is a reference numeral used as a symbol of the capacitor is used as a reference numeral for representing the capacitor and further, represents the capacitance which is the size of the capacitor. For example, C1 may be the reference numeral for representing the capacitor and further, means that the capacitance which is the size of the capacitor is C1.

In addition, in the present specification, "forcing the signal" means that a level of a signal which maintains a predetermined state is changed. For example, applying the signal to an on/off control terminal of a switching element means that the existing low-level voltage is changed to high-level voltage.

Further, in the present specification, a touch detection sensor 10 is constituted by a sensing pad 10a and a non-sensing pad 10b. The sensing pad 10a is a touch detection sensor 10 connected to a touch detection unit 14 in order to detect a touch among a plurality of touch detection sensors 10 and the non-sensing pad 10b is a touch detection sensor 10 that is not connected to the touch detection unit 14 without detecting the touch.

The sensing pad 10a becomes the non-sensing pad 10b after the touch detection is completed and a predetermined non-sensing pad 10b is switched to the sensing pad 10a according to a predetermined order. Therefore, the sensing pad and the non-sensing pad are not fixed and are sequentially determined according to the predetermined order. A time sharing technique is an embodiment of determining an order of the sensing pad and the non-sensing pad.

Further, in the present specification, detecting the touch and detecting the touch signal have the same meaning and means that a difference between voltage detected by a touch detection unit when touch capacitance Ct is not formed because a conductor such as a finger does not contact or approach the touch detection sensor 10 and voltage detected by the touch detection unit by the touch capacitance Ct formed when the conductor such as the finger is opposite to the touch detection sensor is detected.

In addition, in the present specification, a touch drive IC is used while being abbreviated as TDI.

Further, in the present specification, precharge and charge, and precharge voltage and charged voltage are used as the same meaning.

Moreover, in the present specification, the sensing pad 10a means the sensing pad 10a itself and has a meaning including a sensor signal line connected with the sensing pad 10a and the non-sensing pad 10b also similarly means the non-sensing pad itself and has a meaning including a non-sensing pad signal line connected with the non-sensing pad 10b.

Further, a column and a row used in the present specification are terms representing directionality related with an array of the sensing pads or the sensor signal lines and the column represents a direction in which the sensor signal lines are grouped to be directed to the TDI 30 and the row represents a direction perpendicular to a column direction. The column and row directions in the present invention are not used as absolute meanings and are terms indicating the directionality which may be changed according to an arrangement location of the TDI or by other factors.

FIG. 6 conceptually illustrates a 3-terminal switching element among switching elements used as one example of a charging means in the present invention. Referring to FIG. 6, the 3-terminal switching element generally includes three terminals of an on/off control terminal Cont, an input terminal In, and an output terminal Out.

The on/off control terminal Cont is a terminal that controls turn-on/turn-off of the switching element and when voltage or current having a predetermined magnitude is applied to the on/off control terminal Cont, voltage or current applied to the input terminal In is output to the output terminal Out in a voltage or current form.

Prior to describing a detailed embodiment of the present invention, a principle in which touch capacitance and capacitance between lines are formed will be described in brief with reference to FIG. 7.

In the example of FIG. 7, it is assumed that when a finger 25 or a touch means similar thereto approaches the touch detection sensor 10, the touch detection sensor 10 and the finger 25 are spaced apart from each other by an interval of "d" and have an opposite area called "A". Then, as disclosed in a right equivalent circuit and an equation of FIG. 7, capacitance "C" is formed between the finger 25 and the touch detection sensor 10. In the present specification, the capacitance formed between the finger 25 and the touch detection sensor 10 is referred to as touch capacitance or Ct.

Further, in the example of FIG. 7, when two parallel signal lines are spaced apart from each other by the interval of "d" and have the opposite area called "A" instead of the finger 25 and the touch detection sensor 10, the capacitance C between the lines, which is shown in the equivalent circuit and the equation of FIG. 7 is formed even between two signal lines.

When the signal line is made of ITO or a metallic material, a value acquired by multiplying an application thickness of the material and opposite lengths of two signal lines becomes the opposite area of two parallel signal lines and a degree in which two opposite signal lines are spaced from each other becomes a spacing distance. In the present specification, since an optically clear adhesive (OCA) or an air layer is formed between two signal lines, a dielectric constant may adopt the dielectric constant of the OCA or air in the equation of FIG. 7.

FIG. 8 is a circuit diagram illustrating a basic structure of a touch detecting means according to the present invention. Referring to FIG. 8, a touch detecting means specialized according to the present invention is configured to include a charging means 12, a touch detection sensor 10, a sensor signal line 22, a common electrode capacitor Cvcom, a floating capacitor Cp, and a touch detection unit 14.

The charging means 12 is a switching element which supplies Vpre which is a precharge signal (alternatively, a charge signal) to all capacitors connected to the touch detection unit 14 and is turned off by a turn-off signal applied to an "on/off control terminal" called "Cont" to make an output terminal 12-1 with high impedance or a linear element such as OP-AMP that supplies a signal according to a control signal.

As illustrated in the embodiment of FIG. 8, when the 3-terminal switching element is used as the charging means 12, charging voltage appropriate at a necessary time may be supplied to all capacitors connected to the output terminal 12-1 of the charging means 12 by using the control signal supplied to the on/off control terminal and the signal Vpre supplied to an input terminal 12-2.

As the charging voltage, DC voltage including zero volt, AC voltage which is alternated such as a square wave, a triangle wave, or a sine wave or voltage of a type in which the DC voltage and the AC voltage are coupled with each other may be used.

The touch detection sensor 10 is constituted by the sensing pad 10a connected to the touch detection unit 14 to detect the touch signal and a non-sensing pad 10b not connected to the touch detection unit 14 and not detecting the touch signal.

The sensing pad 10a and the non-sensing pad 10b are not fixed and when the same touch detection sensor 10 is connected to the touch detection unit 14 in order to detect the touch by the time sharing technique, the touch detection sensor 10 is referred to as the sensing pad 10a and when the touch detection sensor 10 is spaced apart from the touch detection unit 14, the touch detection sensor 10 is referred to as the non-sensing pad 10b. Therefore, a touch detection sensor 10 is distinguished into the sensing pad or the non-sensing pad according to whether the predetermined touch detection sensor 10 is connected with the touch detection unit 14.

In the embodiment of FIG. 8, a case where one touch detection sensor 10 sequentially becomes the sensing pad and the remaining touch detection sensors 10 are the non-sensing pads is assumed and the touch detection sensor 10 marked with "PC" operates as the sensing pad 10a and all of the remaining touch detection sensors are the non-sensing pads (an embodiment of FULL driving).

At a time before the sensing pad marked with "PC" operates, a touch detection sensor marked with "PB" serves as the sensing pad and after the sensing pad marked with "PC" operates, a touch detection sensor marked with "PD" will serve as the sensing pad from the non-sensing pad. The sensing pad and the non-sensing pad of the touch detection sensor 10 are switched by intervention of a timing control unit 33 of FIG. 13 to be described below.

A touch signal detecting method using one sensing pad of FIG. 8 is an embodiment derived for convenience and a plurality of touch detection sensors may actually simultaneously operate as the sensing pad.

In FIG. 8, the precharge voltage Vpre is applied to a sensing pad signal line 22a and the sensing pad 10a having a symbol of PC and when non-sensing pads having symbols of PB, PD, and PF adjacent to the sensing pad 10a and non-sensing pad signal lines 22b-B, 22b-D, and 22b-F connected therewith are connected to predetermined voltage Vlbl having a predetermined potential difference from Vpre, the capacitance is formed between the sensing pad 10a and the non-sensing pad 22b by a principle described in FIG. 7.

In detail, since Vpre having a predetermined potential is applied to the sensing pad signal line 22a and the sensing pad 10a and the non-sensing pad signal line 22b-B connected to Vlbl has a predetermined opposite distance and a predetermined opposite area to the sensing pad signal line 22a, the capacitance between the lines, which mutually has capacitance C1 is formed by the principle described in FIG. 7, capacitance between the lines, which is called C2 is formed between the sensing pad signal line 22a and the non-sensing pad signal line 22b-D by the same principle, and capacitance between the lines, C3 is formed even between the sensing pad PC, 10a and the opposite non-sensing pad signal line 22b-F by the same principle.

Referring to <Equation 1> or <Equation 2> to be described below, the capacitances C1, C2, and C3 between the lines serve as the parasitic capacitor Cp to serve as the noise that deteriorates the touch sensitivity in the related art.

However, in the present invention, since the capacitor between the lines is reversely used for detecting the touch signal, a plurality of sensitivity enhancement effects are achieved, which enhance the touch sensitivity by reducing Cp in Equation 1 or Equation 2 to enhance the touch sensitivity and positioning the capacitance between the lines, which is the decreased Cp, at a numerator of Equation 1 or Equation 2.

Meanwhile, like C4, even though the non-sensing pad signal line 22b-B is formed between the sensing pad signal line 22a and the non-sensing pad signal line 22b-A, the capacitance between the lines is formed. In the present specification, like C1 to C3, a case where the capacitance between the lines is formed between the sensing pad signal line 22a and the non-sensing pad signal line is referred to as primary line-to-line capacitance and like C4, capacitance formed while one or a plurality of non-sensing pad signal lines is formed between the sensing pad signal line 22a and the non-sensing pad signal line is defined as secondary line-to-line capacitance.

Therefore, a plurality of secondary line-to-line capacitances is formed between the sensing pad 10a and the sensing pad signal line 22a. When the secondary line-to-line capacitance is also used for the touch detection, the touch sensitivity is enhanced, and as a result, all non-sensing pad signal lines for forming the secondary line-to-line capacitance are preferably connected to Vlbl used for forming the primary line-to-line capacitance. Such a method is defined as "full driving method".

Although described below, only a part of the non-sensing pad may be used for forming the secondary line-to-line capacitance and this is defined as "block driving method". The non-sensing pad signal line for forming the secondary line-to-line capacitance may be connected to not Vlbl but another potential, but Vlbl is preferably commonly used for simplifying the circuit.

In order to simplify the circuit and weaken the touch sensitivity, the non-sensing pad signal line (the signal lines such as 22b-A or 22b-E in the embodiment of FIG. 8) generating the secondary line-to-line capacitance may be maintained in a floating or high impedance state, and as a result, the secondary line-to-line capacitance is not generated between the non-sensing pad signal line and the sensing pad signal line which are floated. The TDI generates the secondary line-to-line capacitance and has a means for determining whether to connect the sensing pad signal line 22a and the adjacent non-sensing pad signal line 22b at a predetermined potential or maintain the sensing pad signal line 22a and the adjacent non-sensing pad signal line 22b in the floating or high impedance state. The voltage Vlbl connected to the non-sensing pad signal line 22b is DC potential or AC voltage including zero V.

In the present specification, a term closed is applied even to the non-sensing pad signal line forming the primary line-to-line capacitance and applied even to the non-sensing pad signal line forming the secondary line-to-line capacitance based on the sensing pad signal line.

Since the primary line-to-line capacitances C1 to C3 and the secondary line-to-line capacitance are commonly connected to the sensing pad 10a of FIG. 8, all of them may be expressed as one equivalent capacitor and when this is referred to as a line-to-line equivalent capacitor Ceq, FIG. 8 may be expressed by the equivalent circuit illustrated in FIG. 9.

Meanwhile, the line-to-line equivalent capacitor Ceq has the following features.

1. As the opposite length of the opposite sensor signal lines 22a and 22b increases, the opposite area increases, and as a result, the line-to-line equivalent capacitance Ceq further increases. Therefore, the sensing pad 10a which are farther from the TDI has a larger line-to-line equivalent capacitance Ceq.

2. The magnitude of the line-to-line equivalent capacitance Ceq may be adjusted according to the opposite distance of the opposite sensor signal lines 22a and 22b. Since the opposite distance is a width between the opposite sensor signal lines 22a and 22b, the magnitude of the line-to-line equivalent capacitance Ceq may be changed by a design.

Referring to FIG. 9, the line-to-line equivalent capacitor Ceq is formed between the sensing pad 10a and the adjacent non-sensing pad 10b and the non-sensing pad 10b is connected to predetermined voltage Vlbl. Further, in the case of the non-sensing pad 10b and the non-sensing pad signal line 22b of FIG. 9, a plurality of non-sensing pads and non-sensing pad signal lines forming the primary line-to-line capacitance and the secondary line-to-line capacitance in FIG. 8 are expressed by one equivalent non-sensing pad 10b and one equivalent non-sensing pad signal line 22b. Since driving voltage Vlbl is connected to all non-sensing pad signal lines 22b except for the sensing pad 10a in FIG. 8, the voltage Vlbl is connected to the non-sensing pad signal line 22b even in FIG. 9.

Therefore, although it is illustrated that Vlbl is connected to one non-sensing pad signal line 22b in FIG. 9, Vlbl is actually connected to the plurality of non-sensing pad signal lines generating the primary or secondary line-to-line capacitance.

Vlbl is voltage applied to one side of the non-sensing signal pad line 22b when the precharge voltage Vpre is applied and in detail, voltage for forming the line-to-line equivalent capacitance Ceq through interaction with the precharge voltage. Alternating Vlbl is applied to the non-sensing pad signal line 22b in order to detect the touch signal.

The output terminal 12-1 of the charging means 12 and all capacitors connected with the output terminal 12-1 are connected with the touch detection unit 14. A buffer 14-1 is one of components constituting the touch detection unit 14 and an input terminal of the buffer 14-1 has a high impedance (hereinafter, referred to as Hi-z) property. When the output terminal 12-1 of the charging means 12 is connected to a Hi-z input terminal of the touch detection unit 14 in a Hi-z state, all capacitors Ceq, Ct, Cvcom, and Cp connected between the output terminal 12-1 of the charging means and the buffer 14-1 also become the Hi-z state.

Although described below, since the magnitude of Ceq varies according to the length of the sensing pad signal line 22a connecting the sensing pad 10a, a charging time also varies according to the location of the sensing pad. Since the charging time cannot but be determined as a longest time at the time of determining the charging time as one fixed time, it is disadvantageous in that a touch detection time becomes slow.

Therefore, the TDI has a means capable of determining the charging time. The charging time is determined as a turn-on time of the charging means 12.

In the embodiment of FIG. 9, it is illustrated that the output terminal 12-1 of the charging means 12 is directly connected to the buffer 14-1, but all elements in which inputs are in the Hi-z state, such as a gate of MOS or the gate of TFT may be used while substituting for the buffer 14-1. The reason for making the output terminal 12-1 of the charging means 12 and the touch detection unit 14 be in the Hi-z state is that since there is no discharge path of an isolated charge in the Hi-z state, the magnitude of voltage formed at point P of FIG. 9 is maintained for a long time to easily detect the magnitude of the voltage.

The signal output from the buffer 14-1 is input into an amplifier 14-2. When a variation of the voltage detected at point P of FIG. 9 is small according to the touch or not, the signal is preferably amplified by using the amplifier 14-2. In the amplifier, a DAC 14-3 may be used and the DAC is generated by using voltage of an ref 14-4.

Further, the signal detected and amplified by the touch detection unit 14 may pass through an ADC conversion unit 14-5 to be transferred to a signal processing unit 35 of FIG. 13. One or a plurality of ADC conversion units 14-5 may be used and when the plurality of ADC conversion units 14-5 is used, the signal may be more rapidly processed.

Although not illustrated in FIG. 9, a filter may be used among various functioning units displayed in the touch detection unit 14. For example, the filter may be used even at a previous stage of the buffer 14-1 and the filter may be used as the previous stage of the amplifier 14-2 or some of components of the amplifier. As the filter, various filters may be used, which include a bandwidth low pass filter or a bandwidth high pass filter or a grass cut filter (GCF), a ranking filter, an average filter by chopping, and the like.

The touch detection sensor 10 is made of a transparent conductor or metal. When the touch detection sensor 10 is installed on the display device and made of the transparent conductor, the transparent conductor is made of conductive transparent materials including indium tin oxide (ITO), antimony tin oxide (ATO), carbon nano tube (CNT), indium zinc oxide (IZO), and the like or a transparent material having a conductive property similar thereto.

When the touch detection sensor 10 is applied as a touch keyboard which is not used like the display device and a touch key of a refrigerator or a monitor, the touch detection sensor 10 may be made of a non-transparent material such as metal.

The sensor signal line 22 as a signal line that makes one polarity of the touch capacitance formed when the touch means such as the finger 25 approaches the touch detection sensor 10 access the touch detection unit 14 may be made of the conductive transparent material with the same mask as the touch detection sensor 10.

In any case, the sensor signal line 22 may adopt a different mask from the touch detection sensor 10 and may also be made of the non-transparent material such as metal, etc. The magnitude of resistance of the sensor signal line 22 is expressed by Rt and the magnitude of the resistance of the non-sensing pad 10b is written by Rnt.

Since the resistance components serve as factors which cause the signal to be delayed at the time of detecting the touch signal, the magnitudes of the resistance components are preferably smaller. Therefore, the width of the sensor signal line 22 connected with the touch detection sensor 10 disposed at a long distance from the TDI preferably increases in order to decrease the resistance of the sensor signal line 22 and since an absolute resistance value is small even though the width of the sensor signal line 22 of the touch detection sensor 10 disposed at a short distance from the TDI is small and the resistance thus increases, the width of a path through which the sensor signal lines pass preferably decreases by decreasing the width of the sensor signal line 22 of the touch detection sensor 10 disposed at the short distance from the TDI.

As described above, in the present invention, the width of the sensor signal line may vary according to the location of the touch detection sensor 10.

The common electrode capacitor Cvcom of FIGS. 8 and 9 is capacitance formed when the touch detection sensor 10 is opposite to the common electrode of the display device and one side is connected to the touch detection unit 14 and the other side is connected to common voltage of the display device.

In this case, the common voltage may be applied in direct connection with the common electrode capacitor Cvcom, but applied while being electromagnetically induced through a medium such as glass or air in most cases.

Referring back to FIG. 9, when the finger 25 of the human body approaches the touch detection sensor 10 at a predetermined interval, the touch capacitance Ct called "Ct" is formed between the finger 25 and the touch detection sensor 10. Ct as a value set by a relationship equation of FIG. 7 may be adjusted by controlling the interval between the touch means such as the finger 25 and the touch detections sensor 10, the opposite area, etc.

For example, when the area of the touch detection sensor 10 increases, Ct also increases according to the relational equation of FIG. 7. On the contrary, Ct decreases by configuring the area of the touch detection sensor 10 to be small. As an embodiment, Ct may be designed with several femto Farada (fF) to several tens of micro Farad (uF).

Cp of FIG. 9 as the parasitic capacitor is an equivalent circuit of the parasitic capacitors formed in wire bonding of a semiconductor and a package formed in the TDI and constituting the TDI.

The parasitic capacitor may be constituted by a plurality of parasitic capacitors Cp having different grounds and in the present specification, by assuming only one ground, only one parasitic capacitor connected to one ground is displayed.

Referring back to FIG. 9, Vpre which is the precharge voltage is applied to the input terminal 12-2 of the charging means 12 and when the switching element which is the charging means 12 is turned on by the control voltage Vg applied to the on/off control terminal cont, the precharge voltage Vpre is output through the output terminal 12-1. Therefore, all capacitors connected to the output terminal 12-1 of the charging means 12 are charged with the precharge voltage Vpre.

As an embodiment, if the switching element which is the charging means 12 is turned on when Vpre is 3 V and Vg is changed from zero volt (0 V) to 10 V, potentials of the touch capacitor Ct, the line-to-line equivalent capacitor Ceq, the parasitic capacitance Cp, and the common electrode capacitance Cvcom formed between the sensing pad 10a which detects the touch and the finger 25 after the switching element is turned on are 3 V based on a ground potential connected to one side of each capacitance.

For example, when Vcom which is the common voltage is 4 V, 3 V which is the potential of the common electrode capacitance Cvcom means 3 V based on a case where the common voltage Vcom is 4 V in the case where the potential of point P of FIG. 9 is 3 V. That is, the potential of the common electrode capacitance Cvcom means a difference from the common voltage.

When the charging means 12 is turned off by dropping the control voltage Vg of the charging means 12 from 10 V to 0 V after charging point P of FIG. 9, point P which is the touch detection unit becomes Hi-z and a charge of point P is isolated, and as a result, when the alternating voltage is applied to the line-to-line equivalent capacitor Ceq, the magnitude of the voltage detected at point P is in proportion to the magnitude of the alternating voltage applied to the line-to-line equivalent capacitor Ceq and has a correlation with capacitances connected to point P.

FIG. 10 is a cross-sectional view illustrating one example of a touch detection sensor configuration according to the present invention and FIG. 11 is a cross-sectional view illustrating another example of the touch detection sensor configuration according to the present invention. FIG. 10 illustrates a case where the touch detection sensor 10 is mounted on a substrate formed separately from the display device and FIG. 11 illustrates a case where the touch detection sensor 10 is embedded in the display device. A forming relationship of the common electrode capacitor Cvcom will be described below with reference to FIGS. 10 and 11.

As illustrated in FIG. 10, the display device 200 has a common electrode 220. An AMOLED or PDP has no common electrode with a function to display an image quality, but Cvcom of FIGS. 8 and 9 is formed between various potentials formed on a TFT substrate of the AMOLED or a driving substrate of the PDP and the touch detection sensor 10 opposite thereto, and as a result, a virtual potential constituted by various potentials formed on the TFT substrate of the AMOLED or the driving substrate of the PDP will also be referred to as the common electrode.

The display device 200 may be various types of display devices which are described above and the common electrode 220 may be the Vcom electrode of the LCD or other types of electrodes. In the embodiment of FIG. 10, the LCD among the display devices is exemplified.

The display device 200 illustrated in FIG. 10 has a structure in which a liquid crystal is enclosed between a TFT substrate 205 at a lower side and a color filter 215 at an upper side to form a liquid crystal layer 210. The TFT substrate 205 and the color filer 215 are bonded to each other by a sealant 230 at outer portions thereof in order to enclose the liquid crystal. Although not illustrated, polarizers may be attached onto upper and lower portions of a liquid crystal panel and besides, a back light unit (BLU) may be installed and optical sheets constituting a brightness enhancement film (BEF) may be installed together with the BLU.

A touch screen panel 50 is installed in an upper portion of the display device 200 as illustrated in FIG. 10. In the example of FIG. 10, the touch screen panel 50 is attached to the upper portion of the display device 200 via a bonding member 57 such as a double adhesive tape (DAT) at an outer portion. In addition, an air gap 58 is formed between the touch screen panel 50 and the display device 200 or a contact member 58 is charged between the touch screen panel 50 and the display device 200. The contact member 58 is a material that attaches the touch screen panel 50 and the display device 200, such as transparent silicon, optically clear adhesive (OCA), or adhesive resin.

A common voltage level for displaying an image is applied to the common electrode 220 of the display device 200 and the common voltage is DC or voltage that alternates a predetermined amplitude with a predetermined frequency. For example, in a small LCD in which line inversion is performed, the common voltage of the common electrode 220 is alternated as illustrated in FIG. 5 and DC-level common voltage which is voltage having a predetermined magnitude is applied to an LCD of a notebook or a monitor/TV in which dot inversion is performed.

As illustrated in FIG. 10, the common electrode capacitor Cvcom is formed between the touch detection sensor 10 and the common electrode 220 of the display device 200 and the touch capacitance Ct is formed between the touch detection sensor 10 and the finger 25. As described above, both the common electrode capacitance Cvcom and the touch capacitance Ct are formed in the touch detection sensor 10.

Meanwhile, in FIG. 10, undescribed reference numeral 24 represents a protective layer 24 for protecting the touch detection sensor 10 and adopts glass or plastic or vinyl or cloth.

FIG. 11 illustrates an embodiment of a case where the touch detection sensor 10 is embedded in the display device as another example of the touch detection sensor configuration. Referring to FIG. 11, the touch screen panel 50 may be formed on the top of the color filter 215 which is a part of the display device. Although illustrated in FIG. 11, the common electrode 220 is formed below the color filter 215 and the touch detection sensor 10 is patterned onto the top of the color filter.

In the embodiment of FIG. 11, the protective layer 24 is substituted with the polarizer. Even in the embodiment of FIG. 11, the common electrode capacitance Cvcom is formed between the common electrode 220 and the touch detection sensor 10 and both the common electrode capacitance Cvcom and the touch capacitance Ct are formed in the touch detection sensor 10.

FIG. 12 illustrates an embodiment of applying alternating voltage to the line-to-line equivalent capacitor Ceq in order to detect the touch signal.

Referring to FIG. 12, the touch capacitance Ct, Ceq, Cvcom, and Cp formed between the touch detection sensor 10 and the conductor such as the finger 25 are connected to the output terminal 12-1 of the charging means 12.

Therefore, when the precharge signal Vpre is applied to the input terminal 12-2 of the charging means 12 while the charging means 12 is turned on, Ceq, Ct, Cvcom, and Cp are charged with the precharge level Vpre, and as a result, the potential of the input terminal of the touch detection unit 14 becomes the precharge level Vpre. Thereafter, when the charging means 12 is turned off, the precharge signal level Vpre is maintained if signals charged in four capacitors are not separately discharged.

In order to stably isolate the charged signals, the output terminal 12-1 of the charging means 12 and the input terminal of the touch detection unit 14 are in the Hi-z state and preferably have impedance of 100 Kohm or more. When a touch input is observed, a signal charged by other means is isolated, or the signal is rapidly observed at a discharge start time while the signals charged in four capacitors are discharged, the input terminal of the touch detection unit 14 need not particularly be Hi-z.

The touch detection unit 14 detects voltage (alternatively, voltage of point P) of the sensing pad 10a. The touch detection unit 14 detects the voltage of point P when the touch is not generated (that is, when Ct is not formed) and detects the voltage of point P when the touch is generated (that is, when Ct is formed) to acquire the touch signal by using a difference in magnitude between both detected voltages.

In the embodiment of FIG. 12, the sensing signal resistance Rt is present in the sensing pad 10a and the input terminal of the touch detection unit which is point P, but since the magnitudes of the signals at both ends of Rt after a predetermined time are the same as each other, an influence of Rt is disregarded. Therefore, in the present specification, the voltage detected in the sensing pad 10a and the voltage detected at point P have the same meaning.

In the present invention, when point P of FIG. 12 is charged with the charging voltage Vpre, predetermined voltage Vl or Vh is applied to one side of the non-sensing pad signal line 22b connected with the non-sensing pad 10b. Vl represents low voltage of the alternating voltage of the present invention, Vh represents high voltage of the alternating voltage of the present invention, and the alternating voltage is acquired by alternating Vh and Vl.

Vh or Vl plays the same role as Vlbl described above, that is, a role of forming the line-to-line equivalent capacitor Ceq.

In order to detect the touch signal within a predetermined time after the charging voltage is applied, the alternating voltage is applied to the non-sensing pad signal line 22b. An absolute magnitude of the alternating voltage is Vh-Vl and the potential may be changed from the high voltage Vh to the low voltage Vl or from the low voltage Vl to the high voltage Vh. The alternating voltage is voltage of various forms including a square wave or a triangular wave or a sine wave or a sawtooth wave and the TDI of the present invention may vary the magnitude or frequency of the alternating voltage.

The touch detection unit 14 detects the voltage in synchronization with a rising edge (Rt: rising time) at which the alternating voltage rises from the low voltage Vl to the high voltage Vh or a falling edge (Ft: falling time) at which the alternating voltage falls from the high voltage Vh to the low voltage Vl. When the TDI detects the voltage in synchronization with the rising or falling edge, the TDI preferably detects the voltage after a predetermined time is delayed from an edge. The reason is that a predetermined period of time is required until the detection voltage is stabilized by Rt which is the resistance component of the sensing pad signal line 22a or Rnt which is the resistance component of the non-sensing pad. The TDI may have a means that will determine the predetermined period of time and the predetermined period of time may be determined by a register. In addition, the registor may have various types of times and select one thereamong.

Further, since an electromagnetic wave generated at the rising edge or the falling edge of the alternating voltage may influence a device coupled with the capacitive touch detecting means of the present invention, the TDI of the present invention has a means for adjusting a slope of the rising edge or the falling edge of the alternating voltage.

As an embodiment of the means for adjusting the slope in the TDI, the registor may be used. The time of the rising edge or falling edge may be mapped to a plurality of registors and when one of the plurality of registors is selected, an alternating voltage generation unit 42 of FIG. 13 may adjust the slope of the rising edge or falling edge of the alternating voltage.

When Vh is assumed as 5 V and Vl is assumed as 0 V, the absolute magnitude (Vh-Vl) of the alternating voltage is 5 V. When the alternating voltage is changed from a low level to a high level, the alternating voltage is +5 V which is a positive polarity and when the alternating voltage is alternated from the high level to the low level, the alternating voltage is -5 V which is a negative polarity. The polarity is applied to a touch signal detection equation to be described below.

When point P of FIG. 12 is charged with the charging voltage Vpre, assuming that the voltage applied to the non-sensing pad signal line 22b is Vh or Vl, the line-to-line equivalent capacitor Ceq is charged with voltage having a difference between Vpre and Vh or a difference between Vpre and Vl.

For example, in the case where initial voltage connected to the non-sensing pad signal line 22b is high voltage Vh when Ceq is charged with Vpre, the alternating voltage is alternated from high (Vh) level to low (Vl) level and the polarity of the alternating voltage is negative (−). Further, in the case where the initial voltage connected to the non-sensing pad signal line 22b is low voltage Vl when Ceq is charged with Vpre, the alternating voltage is alternated from the low (Vl) level to the high (Vh) level and the polarity of the alternating voltage is positive (−).

The voltage detected by the touch detection unit 14 by the alternating voltage applied to the non-sensing pad signal line 22b is described below.

1. Voltage Detected when Touch is not Generated $$Vsensor_{nontouch} = Vpre + (Vh - Vl)\frac{C_{eq}}{C_{eq} + C_{vcom} + C_p} \quad \text{[Equation 1]}$$

2. Voltage Detected when Touch is Generated

When the touch is generated, since the touch capacitance Ct is applied to the touch detection unit 14, the voltage detected by the touch detection unit 14 is determined by <Equation 2> given below.

$$Vsensor_{touch} = Vpre + (Vh - Vl)\frac{C_{eq}}{C_{eq} + C_{vcom} + C_p + C_t} \quad \text{[Equation 2]}$$

In <Equation 1> and <Equation 2> given above Vsensor$_{nontouch}$ represents the voltage detected by the touch detection unit 14 when the touch does not occur, Vsensor$_{touch}$ represents the voltage detected by the touch detection unit 14 when the touch occurs, Vpre represents the precharge voltage, Vh represent high-level voltage of the alternating voltage applied to the non-sensing pad signal line 22b, Vl represents low-level voltage of the alternating voltage applied to the non-sensing pad signal line 22b, Ceq represents the line-to-line equivalent capacitance, Cvcom represents the common electrode capacitance, Cp represents the parasitic capacitance, and Ct represents the touch capacitance. When the alternating voltage is alternated from low to high, the polarity of (Vh-Vl) is positive or plus and when the alternating voltage is alternated from high to low, the polarity of (Vh-Vl) is negative or minus.

Referring to the difference between <Equation 1> and <Equation 2>, Ct exists in a denominator of <Equation 2>. Since the touch capacitance Ct is capacitance formed between the sensing pad 10a and the touch means such as the finger 25, the capacitance which is the magnitude of Ct varies according to the occurrence or non-occurrence of the touch or according to the opposite distance or opposite area of the touch means and the touch sensing pad 10a and since the difference in Ct causes the difference between the voltages induced by <Equation 1> and <Equation 2>, when the voltage difference (<Equation 1>-<Equation 2> or <Equation 2>-<Equation 1>) is detected, whether the touch occurs or a touch area may be calculated.

Since <Equation 1> is the value detected by the touch detection unit 14 when the touch does not occur, <Equation 1> is a fixed value. However, when the touch capacitance is applied as shown in <Equation 2>, since the touch capacitance of the voltage detected by the touch detection unit 14 is variable, the magnitude of the voltage detected by <Equation 2> is variable. In the present invention, since whether the touch occurs or not or the touch area is detected by the voltage difference between <Equation 1> and <Equation 2> or <Equation 2> and <Equation 1>, the voltage of <Equation 1> which is the fixed value is preferably stored in a memory device (a memory unit, reference numeral 28 of FIG. 13).

When the voltage of <Equation 1> stored in the memory unit 28 of FIG. 13 may be substituted with the DAC 14-3 of FIG. 9, <Equation 1>-<Equation 2> or <Equation 2>-<Equation 1> may be detected in a simple circuit such as a differential amplifier. Therefore, the present invention has a means for storing the voltage detected by the touch detection unit 14 in the memory in a form of <Equation 1> when the touch does not occur and further, the present invention has a means for substituting the voltage when the touch does not occur, which is stored in the memory with the DAC 14-3.

For example, in the case where the voltage detected by the touch detection unit 14 is 3 V when the sensing pad 10a of FIG. 8 is not touched, the DAC that displays the voltage in non-touch of the sensing pad 10a of FIG. 8 is 3 V. Further, the DAC includes a predetermined offset to display 3 V. For example, when the DAC is 3.5 V, the DAC includes an offset of 0.5 V.

In the case where the voltage detected by the touch detection unit 14 is stored in the memory in non-touch of all touch detection sensors 10, and as a result, when the corresponding touch detection sensor 10 detects the difference from the voltage detected by the touch detection unit when the corresponding touch detection sensor 10 operates as the sensing pad, whether the touch occurs or not and the touch area may be easily detected.

Meanwhile, Vh and Vl are generated in a power supply unit (reference numeral 47 of FIG. 13) in the TDI and the alternating voltage of Vh and Vl is generated by an alternating voltage generation unit (reference numeral 42 of FIG. 13) in the TDI.

Meanwhile, Cvcom may be acquired from <Equation 3> given below.

$$C_{vcom} = \varepsilon 1 \frac{s1}{D1} \qquad \text{[Equation 3]}$$

In <Equation 3>, ε1 represents a complex dielectric constant of media which exist between the touch detection sensor 10 and the common electrode 220. In the case of FIG. 10, since there are the glass, the air layer, the polarizer, and an adhesive for attaching the polarizer to the glass between the touch detection sensor 10 and the common electrode 220, the complex dielectric constant thereof becomes ε1 of Equation 3. Since S1 is the opposite area of the touch detection sensor 10 and the common electrode 220, S1 may be easily acquired. As described in the example of FIG. 10, when the common electrode 220 is formed throughout the entirety of a lower surface of the color filter 215, the opposite area S1 is determined by an area of the touch detection sensor 10. Further, since D1 is a distance between the touch detection sensor 10 and the common electrode 220, D1 corresponds to a thickness of the medium.

As described above, Cvcom is a value which may be easily acquired and a value which may be set.

Ct may be acquired from <Equation 4> given below.

$$C_t = \varepsilon 2 \frac{s2}{D2} \qquad \text{[Equation 4]}$$

In <Equation 4>, ε2 may be acquired from the medium between the touch detection sensor 10 and the finger 25 and when a plurality of media is used, ε2 may be acquired by the composite dielectric constant thereof. When tempered glass is attached onto the top of the touch screen panel 50 in FIG. 10, the dielectric constant ε2 may be acquired from a value acquired by multiplying a specific dielectric constant of the tempered glass by a vacuum dielectric constant. S2 corresponds to the opposite area of the sensing pad 10a and the finger 25.

When the finger 25 covers the entirety of a predetermined sensing pad 10a, S2 corresponds to the area of the touch detection sensor 10. When the finger 25 covers a part of the touch detection sensor 10, S2 is a value acquired by subtracting an area which is not opposite to the finger 25 from the area of the sensing pad 10a.

Further, since D2 is a distance between the sensing pad 10a and the finger 25, D2 will correspond to the thickness of the protective layer 24 which is laid on the top of the touch screen panel 50.

As described above, Ct is also a value which may be easily acquired and a value which may be easily set by using the material and the thickness of the protective layer 24 or the tempered glass laid on the top of the touch screen panel 50.

Since Ct is in proportion to the opposite area of the finger 25 and the touch detection sensor 10 according to <Equation 4>, a touch occupation rate of the finger 25 to the touch detection sensor 10 may be calculated from Ct.

A method for calculating the touch occupation rate of the finger 25 will be described below. Referring to <Equation 1> and <Equation 2>, the difference between <Equation 1> and <Equation 2> is a difference in terms of existence of the touch capacitance Ct according to whether the touch occurs. When it is assumed that all capacitances cited in <Equation 1> have a predetermined fixed magnitude and it is assumed that Vpre is also the fixed value, only Ct may be calculated by using the voltages detected in <Equation 1> and <Equation 2>.

In <Equation 4>, when ε2 and D2 are the fixed values, the touch capacitance Ct and the touch area are in proportion to each other. Therefore, the area may be calculated by the extracted Ct. When the area is acquired by using <Equation 1> and <Equation 2> as described above, both the voltage detected by <Equation 1> and the voltage detected by <Equation 2> are used. Further, in the present invention, the touch area may be calculated based on the voltage detected by the touch detection unit 14.

FIG. 13 as a configuration diagram illustrating an embodiment of the touch screen panel of the present invention illustrates an example in which the touch detection sensors 10 are arranged in a dot matrix form.

A constitution of the TDI 30 is illustrated at a lower end of FIG. 13. The TDI 30 may include a driving unit 31, the touch detection unit 14, a timing control unit 33, the signal processing unit 35, the memory unit 28, the alternating voltage generation unit 42, the power supply unit 47, and a communication unit 46 and besides, the TDI 30 may further include a CPU 40. The CPU 40 is a microprocessor having a calculation function and may be positioned outside the TDI 30.

The charging means 12 is included in the driving unit 31 and the driving unit 31 includes a function to access the touch detection unit 14 by selecting the sensing pad and the non-sensing pad among the plurality of touch detection sensors 10. Further, the driving unit 31 includes a function to connect one side of the non-sensing pad signal line 22b to Vh or Vl during a charging operation using the charging means 12.

Referring to <Equation 1> or <Equation 2>, since there is the difference in magnitude of the detection voltage by the magnitude of (Vh-Vl) which is the alternating voltage, the TDI may include a means capable of changing the magnitude of the alternating voltage therein in order to adjust the touch sensitivity. As the magnitude of the alternating voltage increases, the magnitude of the detection voltage increases and this means that detection sensitivity is high.

A registor for controlling the magnitude of Vh-Vl which is the magnitude of the alternating voltage is installed in the TDI. The registor has a plurality of addresses and magnitudes of different alternating voltages are mapped to the respective addresses. The magnitude of the alternating voltage corresponding to the value of the selected registor is transferred to the driving unit 31 and applied when the touch signal is detected.

The timing control unit 33 serves to generate a plurality of different clocks required in the TDI. For example, a clock is required for operating the CPU 40 and the clock is required even for operating the ADC or sequentially operating multiplexers of the driving unit 31. The There are various clocks required for each function as described above and the timing control unit 33 generates and supplies the plurality of various clocks.

The signal processing unit 35 transfers the ADC value generated by the touch detection unit 14 to the CPU 40, transmits the ADC value to the outside of the TDI 30 through an I2C or an SPI signal line by controlling the communication unit 46, or generates and supplies a signal required in an element for each of all functions in the touch detection unit 35 or the TDI 30 such as the driving unit.

An element for each function or a block for each function refers to each function illustrated in FIG. 13. For example, at present, 9 blocks for each function are included in the TDI and the CPU 40 is one of the 9 blocks. The signal processing unit 35 may receive the ADC value generated by the touch detection unit 14 in the memory unit 28 and perform a required calculation.

For example, the signal processing unit 35 may calculate the touch area due to the touch of the touch detection sensor 10 and the contact means by referring to the ADC value generated by the touch detection unit 14 and further, calculate a touch coordinate by using the ADC value or a calculated area value.

The memory unit 28 is constituted by a flash memory, an E2PROM, an SRAM, or a DRAM. Further, the memory unit 28 includes a frame memory that stores the touch signal detected by the sensing pad 10a. The frame memory is mapped with the touch detection sensor 10 one to one. Various registor values required for driving the TDI 30 or a program required for operating the CPU 40 is stored in the flash memory or E2PROM.

The CPU 40 has a lot of functions overlapped with the signal processing unit 35. Therefore, the CPU 40 may not be included in the TDI 30 or positioned outside the TDI 30. When the CPU 40 and the signal processing unit 35 are simultaneously used, one may not be used.

The CPU may play most roles played by the signal processing unit 35 and extracts the touch coordinate, performs gestures including zoom, rotation, move, and the like, or performs various functions.

Further, a zooming signal may be generated by calculating the area of the touch input, a strength of the touch input may be calculated, or data are processed in various forms such as recognizing only a GUI object (for example, in which a large area is detected) desired by a user as an effective input, and the like to be used in the TDI 30 or transmitted to the outside by using a communication line when GUI objects such as a keypad are simultaneously touched.

A program for controlling the CPU 40 may be installed in the memory unit 28 and substituted with a new program when a modification is generated. A new program is executed by using serial communication of a communication bus included in the communication unit 46, for example, I2C, SPI, or a USB or parallel communication such as a CPU interface (hereinafter, referred to as I/F).

The communication unit 46 outputs required information to the outside of the TDI 30 or performs a function to input information provided from the outside of the TDI 30 into the TDI. In the communication unit, the serial communication of the I2C or SPI or the parallel OF such as the CPU interface is used.

The alternating voltage generation unit 42 generates the alternating voltage applied to the line-to-line equivalent capacitor Ceq. The high voltage Vh and low voltage Vl of the alternating voltage are generated by the power supply unit 47, and the alternating voltage generation unit 42 combines the high voltage Vh and the low voltage Vl to generate the alternating voltage, thereby enabling the driving unit to use the alternating voltage. Further, the alternating voltage generation unit 42 has a means that adjusts the slope of the rising or falling edge of the alternating voltage.

FIG. 13 illustrates an embodiment of a device for detecting a capacitive touch, which detects a touch by using a sensing equivalent capacitor of the present invention. Referring to FIG. 13, the touch detection sensor 10 marked with a deviant slash line of FIG. 13 is the sensing pad 10a that detects the touch signal and the touch detection sensor 10 with no deviant slash line is the non-sensing pad 10b that does not detect the touch.

In this case, the sensing pads 10a are enabled to cross each other like COL1 and COL2 and the touch signal is enabled to be detected in the same row like COL3 and COL4. Since mutual interference occurs in (C3, R1) and (C4, R1) when the touch signal is detected in the same row like COL3 and COL4, a DC line 1310 having the zero potential, ground, or DC voltage is preferably disposed between (C3, R1) and (C4, R1) as illustrated in FIG. 13.

When too many touch detection sensors 10 detect the touch signal as illustrated in FIG. 13, a lot of time is required for detecting the touch signal by using one ADC, and as a result, the touch signal may be lost.

Of course, it is possible to detect the touch signal within a short time by increasing the quantity of ADCs, but when the quantity of ADCs increases, a volume of the TDI 30 increases, and as a result, a price of the TDI increases and consumption current increases.

In order to solve such a problem, a preferred embodiment is to select one sensing pad 10a in one column. One of methods for extracting one sensing pad 10a among the plurality of touch detection sensors 10 included in one column is to use a multiplexer (hereinafter, referred to as mux).

FIG. 14 illustrates an embodiment regarding the use of a multiplexer. The embodiment of FIG. 14 represents a case in which 5 groups are provided and one group includes 6 touch detection sensors 10 (the number of groups and the number of touch detection sensors are just an embodiment only for the description and actually, more groups may be added and more touch detection sensors 10 may be added into one group).

In the embodiment of FIG. 14, the group is an aggregate of the touch detection sensors 10 sharing a mux 31a. The mux 31a is a 6 in×1 out type that outputs one signal with respect to 6 inputs. In an actual use example of the mux, various embodiments may also be selected like a case of 20 in×1 out (selecting one among 20 inputs) or 30 in×1 out (selecting one among 30 inputs).

A select signal is required for selecting one among various signals input into the mux 31a. Two select signals will be required for selecting one among 4 input signals and three select signals will be required for selecting one among 8 input signals.

In the embodiment of FIG. 14, since one output signal among 6 input signals needs to be determined, at least three select signals are required and displayed as "A, B, and C" 400.

When the select signals are commonly applied to all muxs 31a, only one select signal generator 400 may be present, and as a result, a circuit for the select signal generator becomes simple and the TDI 30 also becomes simple. In the embodiment of the present invention, all of the select signals generated by one select signal generator are commonly applied to all muxs.

Further, it is preferable to use the same type of mux 31a in order to simplify the circuit. The same type of mux means a case where 1) the number of the same inputs, 2) the number of the same outputs, 3) the number of the same select signals, and 4) an order of input signals selected with respect to a predetermined select signal are the same (that is, means that when ABC is Hi(1)/Lo(0)/Lo(0), a 5-th signal among 6 signals input into the mux is selected and the 5-th signal is output).

Since all of the muxs of the present invention are the same type, a connection method of the touch detection sensor 10 and the mux is also the same in the group connected with the mux 31a.

Referring back to FIG. 14, ROW #1 is allocated to all of input #1 of the mux 31a and ROW #2 is allocated to input #2 of the mux. Last ROW #6 is allocated to mux input #6 and such a wiring method is the same in the respective muxs. Therefore, except for an exceptional case, the touch detection sensors 10 positioned in the same ROW are used for detecting the touch signal.

Referring to FIG. 14, first, ROW1 becomes the sensing pad 10a and the remaining rows become the non-sensing pad 10b and when detecting the touch signal in ROW1 ends, ROW1 becomes the non-sensing pad and ROW2 becomes the sensing pad and the touch detection sensors of all rows except for ROW2 become the non-sensing pads. That is, the sensing pad passes through a process of ROW1→ ROW2→ ROW3→ROW4→ROW5→ROW6→ROW1→ROW2→ . . . and all of the remaining sensing pads except for such a sensing pad become the non-sensing pads.

Although described below, in a block driving method, some of the non-sensing pads are used for forming the secondary line-to-line capacitance and some non-sensing pads are connected to the DC power or floated.

A full driving method which is one of the technical spirit of the present invention will be described below.

As described above, as the secondary line-to-line capacitances are more, the touch sensitivity is enhanced, and as a result, it is preferable to form secondary line-to-line capacitances which are more as possible. To this end, while all remaining touch detection sensors 10 other than the sensing pad 10a are the non-sensing pads, the same alternating voltage is applied to all of the non-sensing pads.

That is, full driving means applying the alternating voltage to all non-sensing pads 10b other than the sensing pad 10a that is detecting the touch signal and detecting the touch signal in synchronization with the alternating voltage.

When a lot of sensing pads 10a are present in one row, for example, when it is assumed that the number of sensing pads 10a is 30, it may not be preferable to process the touch signal with one ADC due to a possibility that the touch signal will be lost. In this case, one row is divided into an odd (column) and an even (column) to be distinguished into the sensing pad 10a and the non-sensing pad 10b.

That is, when the odd column in a predetermined row becomes the sensing pad, the even column becomes the non-sensing pad, and as a result, during the full driving, the even column of the row including the sensing pad may also become the non-sensing pad 10b. For example, in the embodiment of FIG. 13, when the touch signal is detected in the ROW1, only (C1,R1), (C3,R1), and (C5,R1) which are the odd columns are the sensing pad 10a that detects the touch signal and (C2,R1) and (C4,R1) which are the even columns becomes the non-sensing pad that does not detect the touch signal. Similarly, when the even column becomes the sensing pad, the odd column of the same row may become the non-sensing pad.

Further, there is also a method of dividing the row by 2 in addition to dividing the row into the even number and the odd number. That is, such a method is a method in which columns #1 to #15 become the sensing pads and columns #16 to #30 become the non-sensing pads.

Alternatively, it is also possible to detect the touch multiple times of three times or more. For example, there is a method in which one row is scanned three times by dividing 45 touch detection sensors into 3 by 15 when there are 45 touch detection sensors 10 in one row. In this case, each 15 touch detection sensors constitute one subset and the 45 touch detection sensors are scanned while being divided into three subsets.

The alternating voltage which falls from high to low may be applied to the non-sensing pad or the alternating voltage which rises from low to high may be applied to the non-sensing pad.

There is a problem which needs to be considered when the touch signal is detected in synchronization with the time of applying the alternating voltage which rises from low to high.

Referring to [Equation 1] or [Equation 2], when (Vh-Vl) is the rising alternating voltage, the polarity of (Vh-Vl) becomes plus, and as a result, a calculation value of Equation 1 or Equation 2 becomes larger than that when (Vh-Vl) is the falling alternating voltage. For example, when the calculation value of $$\frac{C_{eq}}{C_{eq}+C_{vcom}+C_p}$$

included in Equation 1 and Equation 2 is assumed as 0.5 and (Vh-Vl) is assumed as 10 V and the rising alternating voltage, the calculation value of Equation 1 in the case where Vpre is 1 V becomes 6 V.

In most cases, operating voltage of the CPU or logic is equal to or lower than 3 V and since it is advantageous that the ADC or DAC also operates at low voltage for generating the consumption current or operating voltage, detection voltage of 6 V is voltage which is difficult to operate.

In order to solve the problem, the touch is detected in synchronization with the time when the alternating voltage falls in the preferred embodiment of the present invention. When the calculation value of $$\frac{C_{eq}}{C_{eq}+C_{vcom}+C_p}$$

is 0.5 and (Vh-Vl) is 10 V and the falling alternating voltage, the calculation value of Equation 1 or Equation 2 is enabled to be induced to a desired voltage band by adjusting the magnitude of Vpre.

For example, when Vpre is 7 V, the calculation value of Equation 1 becomes 2 V. As described above, in the present invention, the alternating voltage which falls from high to low is used when the touch is detected and Vpre is determined so that the calculation value is induced into the voltage based on the falling alternating voltage and a calculation equation of Equation 1 or Equation 2. In this case, Vpre is set larger than the calculation value or an actual measurement value of an item except for Vpre in Equation 1 or Equation 2.

When there are the sensing pad and the non-sensing pad in the same row, the rising alternating voltage or preferably the falling alternating voltage is applied even to the non-sensing pad together included in the row where the sensing pad is present similarly to other non-sensing pads in the case of the full driving method.

However, when the display device is the LCD, the alternating voltage influences the LCD to influence a display quality of the LCD. Further, even when the display device is all other display devices other than the LCD, electrical interference is caused in the display device to cause the display quality of the display device to deteriorate.

One of the methods for solving the deterioration of the display quality is the block driving method and is described below and in another method, an alternating polarity of the alternating voltage of the non-sensing pad (hereinafter, referred to as sensing-non-sensing pad) which is present in the same row as the sensing pad is differentiated or the polarity of the alternating voltage of the non-sensing pad in a row different from the row in which the sensing pad is positioned is differentiated in the full driving method.

Differentiating the polarity of the alternating voltage may mean a case of differentiating the polarity with the same magnitude of (Vh-Vl) and a case where the magnitude is also different and the polarity is also different. When the alternating voltage having an inverse polarity to the alternating voltage applied to the non-sensing pad is applied in order to minimize an influence exerted to the display device during the full driving, electromagnetic energies are offset to each other, and as a result, the influence exerted to the display device is reduced.

The following methods are presented in order to solve electrical interference in the full driving.

1. First Method
   1) Precondition: The falling alternating voltage is applied to the non-sensing pad except for the row where the sensing pad is present (the rising alternating voltage may be applied).
   2) Implementation method of first method: When the sensing pad and the non-sensing pad (sensing-non-sensing pad) are present in the same row, the rising alternating voltage is applied to some or all of the sensing-non-sensing pads (the falling alternating voltage may be applied to the sensing-non-sensing pad when the rising alternating voltage is applied to the non-sensing pad). That is, the alternating voltage applied to the non-sensing pad and the alternating voltage having an inverse phase are applied to the sensing-non-sensing pad.

2. Second Method
   1) Precondition: The falling alternating voltage is applied to the non-sensing pad.
   2) Implementation method of second method
     (1) The alternating voltage applied to the non-sensing pad and the alternating voltage having an in-phase or the inverse phase may be applied to the sensing-non-sensing pad (non-sensing pad in the same row as the sensing pad).
     (2) The alternating voltage applied to the sensing-non-sensing pad and the alternating voltage having the inverse phase are applied to one or a plurality of rows of non-sensing pads other than the row including the sensing pad.

Referring to FIG. 13, the second method will be described below.

When it is assumed that the sensing pad 10a is present in ROW4 of FIG. 13, the rising alternating voltage is applied to ROW3 and ROW5 and the falling alternating voltage is applied to the remaining rows. One ROW3 and one ROW5 are present in the front and the rear of ROW4, respectively, but two or three or more of a plurality of rows may be used.

The voltage having the inverse phase is preferably applied to the front and the rear of ROW including the sensing pad 10a. However, the inverse phase may be applied only to one side. Further, the rising alternating voltage may be applied only to some of selected rows to which the rising alternating voltage is applied and the falling alternating voltage may be applied to some rows.

FIG. 15 is a diagram illustrating one example of block driving. Referring to FIG. 15, a touch product constituted by 8 columns and 10 rows is provided. 8 columns are 8 groups using 8 muxs (the group is an aggregate of the touch detection sensors sharing the mux).

It is assumed that ROW6 detects the touch. Even in the block driving, all ROW6 or a part of ROW6 such as an even column or an odd column may serve as the sensing pad that detects the touch (as described above).

In the block driving, only the touch detection sensor 10 adjacent to the sensing pad becomes the non-sensing pad and the remaining touch detection sensors 10 are connected to the DC potential or floated. Referring to FIG. 15, since the sensing pad is present in ROW6, the falling alternating voltage is applied only to two rows in each of the front and the rear of the row (it is described above that the rising alternating voltage may also be applied, but preferably, the falling alternating voltage is applied). One row may be selected in each of the front and the rear of the row including the sensing pad and as illustrated in FIG. 15, two or more of a plurality of non-sensing pads may be selected as the non-sensing pad.

One or a plurality of non-sensing pads may be positioned only at an upper side or a lower side of the row including the sensing pad. Further, the alternating voltage may be applied only to the non-sensing pads positioned above and below the sensing pad and the alternating voltage may not be applied to the non-sensing pads positioned above and below the sensing-non-sensing pad.

All of the remaining rows other than the row which is selected as the non-sensing pad and applied with the alternating voltage may be connected to the DC potential having zero voltage, or ground, or a predetermined potential or maintain a floating state in which the remaining rows are not connected to any place.

Referring back to FIG. 15, when the touch detection of ROW6 is completed, ROW7 will detect the touch and assuming that two non-sensing pads are present in the front and the rear, when the sensing pad is present in ROW7, ROW5 and ROW6 and ROW8 and ROW5 will become the non-sensing pads.

Further, the present invention includes a means for selecting one of the blocking driving or the full driving and as an embodiment, this is available by set-up of the registor. For example, a registor "FULL_BLOCK" is designed and the full driving will be available in a high state and the block driving will be available in a low state.

Further, the present invention has a means for determining a location where the non-sensing pad is present in the block driving. As an embodiment, when a registor value is 0 by a 2-bit registor called BLOCK_position, the non-sensing pads are positioned in the front and the rear of the sensing pad, when the registor value is 1, the non-sensing pad is positioned in the front (a row farther from the TDI based on the row where the sensing pad is positioned, that is, a row closeer to ROW1) of the sensing pad, and when the registor value is 2, the non-sensing pad may be positioned in the rear (a row closer to the TDI based on the row where the sensing pad is positioned, that is, a row closer to ROW5) of the sensing pad.

As a detailed example, ROW6 is the front of ROW7 and the rear of ROW5.

Further, the present invention has a means for setting the number of rows including the non-sensing pad in the block driving. For example, when the value of the 2-bit registor called ROW_num is 0, one row will be selected, when the value of the 2-bit registor is 1, two rows will be selected, and when the value of the 2-bit registor is 2, three rows will be selected.

When two rows in the front and the rear of the sensing pad serve as the non-sensing pad in the block driving to form the primary line-to-line capacitance and the secondary line-to-line capacitance, there is a problem in that two rows at start scan, that is, ROW1 and ROW2 and two rows at last scan, that is, ROW9 and ROW10 are different from other rows in the amounts of the primary and secondary line-to-line capacitances and this causes a difference in touch sensitivity.

In order to solve the problem, a rotation function to continuously connect a start point and an end point is required.

FIG. 16 illustrates an embodiment regarding a rotation function. Referring to FIG. 16, when a case where two rows in the front and the rear of the sensing pad serve as the non-sensing pad is given as an example, ROW4/5 and ROW7/8 serve as the non-sensing pads when ROW6 serves as the sensing pad and ROW5/10 and ROW2/3 serve as the non-sensing pads when ROW1 serves as the sensing pad. Serving as the non-sensing pad as if the start point and the end point are connected to each other is defined as the rotation function.

FIG. 17 illustrates a new design technique of the touch detection sensor 10 based on the rotation function. Referring to FIG. 17, a sensor signal line 22 (1700) of the end point ROW (ROW9/10) is opposite to the sensor signal line 22 of a time (ROW1) of an adjacent group to form the primary or secondary line-to-line capacitance.

The number of separate opposite sensor signal lines is preferably the same as the number of rows including a predetermined non-sensing pad. In the embodiment, since two rows are present in each of the front and the rear of the sensing pad, it is preferable to dispose two separate opposite sensor signal lines.

Further, as a property of the separate opposite sensor signal line, two sensor signal lines are originated in one touch detection sensor 10 and one side is connected to the TDI 30 and the other side is disposed to be spaced apart from a sensor signal line at a time of another group by a predetermined interval. In addition, the sensor signal lines are arranged at left and right sides of the originated touch detection sensor, respectively.

An interval at which the line at the end point and the touch detection sensor at the time of the other group are spaced apart from each other does not preferably exceed a general interval between the touch detection signal lines 22 and +−500%.

The full driving method and the block driving method in the present invention may be applied to various types of touch panels in addition to the touch panel described above.

In particular, in the following embodiment, an embodiment in which the full driving and the blocking driving are applied to remapping of the touch detection sensor is examined.

First, the remapping is examined.

The remapping used in the present invention means a calculation action such as a process of rearranging the touch signals stored in the memory unit of the TDI to match a layout of the touch detection sensors. During the remapping process, in order to calculate an accurate touch coordinate where the touch of the conductor occurs, a series of calculation processes of matching the touch detection signal stored in the memory unit of the TDI with the layout of the touch detection sensor needs to be additionally performed.

The remapping process is performed when the TDI adopted to detect the remapping process has a memory having an array other than an array of X×Y in the display device an array of the touch detection sensors of X×Y.

When described in detail with reference to FIG. 14, since each of 5 groups includes 6 touch detection sensors 10, 6 input pins are allocated to one group (alternatively, mux) in the TDI 30. That is, in FIG. 14, muxs having the same number of input pins are allocated to 6 touch signal lines constituting one column, such as #1 to #6, #7 to #12, and the like to constitute the TDI. In the embodiment of FIG. 14, the calculation step of the remapping described above is not separately required.

However, unlike the embodiment of FIG. 14, the remapping process may be performed when each mux of the groups constituting the TDI may not accommodate the entirety of one group in the touch detection sensor and is shifted to another mux.

As the display device becomes larger, the touch detection sensors 10 are added in a horizontal or vertical direction or both the horizontal and vertical directions, and as a result, the number of TDIs may need to increase. For example, when the numbers of resolutions of the touch detection sensor, which is optimized for a 7-inch display device are 20 in the horizontal direction and 20 in the vertical direction, the TDIs are required, which are more than the TDIs used in the 7-inch display device in order to use the TDI which is the same as the TDI used in the 7-inch display device in a 14-inch display device by 4.

Further, when an 8-inch display device is slightly larger than the 7-inch display device, a layout for 20 horizontal touch detection sensors and 22 vertical touch detection sensors may be an optimal layout. To this end, the number of the TDIs 30 that need to detect the touch signal in 20×20 resolution, that is, 400 touch detection sensors 10 in the related art is 440 and a touch detection number of a detection target increases.

If a separate TDI capable of accommodating 20×22 is not manufactured, when the touch signal is detected by using the TDI used in the 7-inch display device, the number of touch signal detection signals limited to 400 may not be increased, and as a result, the resolution of the touch signal detected with respect to one of an X direction and a Y direction may be partially abandoned and the resolution in the other direction may be adjusted.

In the case of the 8-inch display device, assuming that the layout of the touch detection sensors of 18×22 is optimal, in this case, it is assumed that in a touch resolution of X×Y (alternatively, width×length), X (alternatively, width) is the number of groups and the number of Ys (alternatively, length) is the number of touch detection sensors 10 included in one group. A technique called the remapping needs to be used for using the TDI 30 optimally designed for configuring the 20×20 touch detection sensors in the 18×22 display device and the device and the method for detecting the touch using the sensing equivalent capacitor in the present invention are similarly applied to the touch panel related with the remapping.

FIG. 18 illustrates an embodiment for describing arranging only the sensor signal line 22 from a right side to a left side and remapping of the touch detection sensor 10 in the embodiment of FIG. 14.

When the horizontal touch resolution is more important, it is possible to use a display device of an array having 6 or 7 columns in the horizontal direction and the number of sensors decreased in the vertical direction.

In the touch panel of the present invention, it is possible to increase a touch detection resolution by connecting the touch detection sensor 10 used in another group in the vertical direction.

As illustrated in the embodiment of FIG. 18, in the present invention, the sensor signal line may be disposed at any side of the left side and the right side of the touch detection sensor 10.

The TDI 30 used in the embodiment of FIG. 14 accommodates 5 mux groups and 6 touch signal lines capable of accommodating 6 touch detection sensors 10 in the respective groups.

FIG. 18 as a diagram for describing remapping illustrates one example in which the TDI 30 optimized for touch detection sensors of 6×5 array is adopted for use in touch detection sensors of 4×7 array.

In detail, each mux group is not capable of accommodating all touch signal lines of each column, but the number of input pins of the entire TDI 30 is capable of accommodating all touch signal lines of the touch detection sensors.

As illustrated in FIG. 18, the touch signal of the touch detection sensor of (C2,R1) of a first column is not received by a mux 31-1 of group 1 and received by a mux 31-2 of group 2.

Similarly, the touch signals of the touch detection sensors of (C3,R1) and (C3,R2) of a second column is not received by the mux 31-2 of group 2 and received by a mux 31-3 of group 3.

Further, (C4,R1), (C4,R2), and (C4,R3) of a third column are not received by the mux 31-3 of group 3 and received by a mux 31-4 of group 4.

7 touch signal lines of each column in FIG. 18 are not individually accommodated by each mux group having 6 input pins, but a mux group having a total of 30 input pins is capable of accommodating all of 28 touch signal lines.

Two input pins of the mux of group 5 are maintained while the touch signal line is not connected.

An operation of the mux in FIG. 18 is performed similarly as described in FIG. 14. That is, one output may be discharged by the select signal generated by the select signal generator 400 and the same select signal may be adopted with respect to all mux groups. In this case, the touch detection sensors 10 in the same row are selected for detecting the touch signal.

In the embodiment of FIG. 14, when the same select signal is selected, the touch detection sensors simultaneously detected in the TDI become (C1,R1), (C2,R1), (C3,R1), (C4,R1), and (C5,R1). The layout of the touch detection sensor is a result different from FIG. 14 and the touch detection sensors in the same row are selected in FIG. 14 even by the same select signal, but in FIG. 18, it can be seen that the touch detection sensors (parts with a deviant crease line of FIG. 18) are selected in different rows in FIG. 18 unlike FIG. 14.

In other words, in the remapping technique of the present invention, a rule in which the touch detection sensors are scanned for each of the same row is broken and the touch detection sensors are simultaneously scanned in multiple rows.

The part with the deviant crease line of FIG. 18 represents a first scanned sensor 10 as ROW1 of FIG. 14, but illustrates a case where the row is changed by the remapping. Further, only one sensor 10 is not selected in one column, but when a left column of FIG. 18 is viewed, two sensors 10 may be selected in one column.

It is assumed that the touch occurs in a remapping environment of the sensor 10 illustrated in FIG. 18, and as a result, an area illustrated in FIG. 19 is detected.

The touch detection sensors 10 are enabled to be remapped, but a specific region (hereinafter, referred to as frame memory) of the memory unit 28 mapped with the touch detection sensor 10 in the TDI 30 one to one is disabled to be remapped, and as a result, when the frame memory of the memory unit 28 of the TDI 30 is read, the frame memory will be read as illustrated in FIG. 20.

Since the memory unit 28 distinguishes and stores the touch signals received by the mux of each group, the touch signals will be stored and further, read as illustrated in FIG. 20.

That is, (C2,R1) of FIG. 18 is disposed in group 1 in the touch detection sensor, but the sensor signal line connected to (C2,R1) is connected to the mux of group 2 to be stored in a first row of column 2 as illustrated in FIG. 20.

Similarly, locations of (C3,R1), (C3,R2), (C4,R1), (C4,R2), (C4,R3), (C5,R1), (C5,R2), (C5,R3), (C5,R4), and the like in the group in the touch detection sensor and the mux group are different.

Since it is impossible to extract the touch coordinate using the touch signal in a situation illustrated in FIG. 20, that is, a situation in which the touch signals are individually separated, the touch detection sensor needs to be remapped to the frame memory illustrated in FIG. 19 in a RAM region of the memory unit 28.

The frame memory in the memory unit 28 in the present invention is related with the group of the mux and this will not particularly be similar to the frame memory of the touch detection sensor.

When the frame memory of the memory unit 28 is not mapped with the frame memory of the touch detection sensor one to one, an additional process of remapping is required in the RAM region of the memory unit 28.

That is, in the present invention, raw data stored in the memory is remapped so as to be mapped with the remapped touch detection sensor 10 based on the raw data mapped with the touch detection sensor 10 one to one.

The remapping process refers to a process of rearranging the frame memory of the memory unit according to a column coordinate of the touch detection sensor.

When the remapping process in the present invention is used, there may be an effect in that it is advantageous in terms of reducing production cost of the TDI.

In the touch panel of the present invention, the number of all input pins of the multiplexer is larger than the number of all touch signal lines of the touch detection sensors, but when the number of input pins receiving the touch signals of the respective multiplexers is configured to be smaller than the number of touch signal lines in each column of the touch detection sensor connected to the input pin, there is a property that the TDI may be just used, which is used when the number of respective columns of the touch detection sensors and the number of input pins of each multiplexer match each other one to one.

The remapping which is the property of the present invention refers to a process performed so that the touch signal stored in the memory unit matches the array of the touch detection sensors. That is, the remapping represents a process of rearranging the touch signals stored in the memory unit based on a coordinate of the column of the touch detection sensor.

The rule of row scanning is different from the rule in the embodiment in FIG. 14 by the remapping in the full driving or blocking driving of the present invention.

That is, when the remapping is not performed, the touch detection sensor is scanned by the unit of the row (the embodiment of FIG. 14), but when the remapping is performed, the touch detection sensor is scanned not by the unit of the row (that is, a concept of line) as described in the embodiment of FIG. 18 but by the unit of a point (that is, a concept of random).

Since only the location of the touch detection sensor 10 is just changed in the remapping, all aforementioned technical spirit applied in the full driving or block driving are similarly applied. That is, only a physical location of the touch detection sensor is changed by the remapping.

As a result, in the case of the full driving, the sensing-non-sensing pads may not be positioned in the same row.

Further, in the block driving, the non-sensing pads may not be positioned in the same row but distributed and positioned in multiple rows.

Further, in the present invention, two touch detection sensors 10 may serve as the sensing pad 10a that detects the touch in one column by the remapping. In addition, in the present invention, a remapped type of FIG. 18 may be designed as the TDI 30 of an unremapped type. That is, referring to FIG. 18, the TDI has four groups, that is, four muxs and has 7 touch detection sensors.

As a result, in column 1 of FIG. 18, two touch detection sensors 10 need to simultaneously serve as the sensing pad 10a for acquiring the touch signal. However, in such a method, the design of the mux needs to vary for each group and the select signals need to be individually given.

Referring to FIG. 18, an operation of improving the touch sensitivity by using the sensing equivalent capacitor which operates as the parasitic capacitor in the related art for the touch detection in the touch panel in which the remapping is required because the frame memory (6×5) of the memory unit 28 is different from the frame memory (7×4) of the touch detection sensor is described in detail.

Full Driving Operation

As mentioned above, in the touch pad requiring rematching, the touch detection sensor is scanned by the unit of the point (alternatively, the unit of the column) unlike the embodiment in FIG. 14.

Referring to FIG. 18, in group 1 (alternatively, column 1), the touch detection sensors of (C1,R1) and (C2, R1) become the sensing pads and the remaining touch detection sensors of (C1,R2), (C1,R3), (C1,R4), (C1,R5), and (C1,R6) become the non-sensing pads. In group 2, the touch detection sensor of (C3,R1) becomes the sensing pad and the remaining touch detection sensors of (C2,R2), (C2,R3), (C2,R4), (C2,R5), (C2,R6), and (C3, R1) become the non-sensing pads. In group 3, the touch detection sensor of (C4,R1) becomes the sensing pad and the remaining touch detection sensors of (C3,R3), (C3,R4), (C3,R5), (C3,R6), (C4,R2), and (C4, R3) become the non-sensing pads. In group 4, the touch detection sensor of (C5,R1) becomes the sensing pad and the remaining touch detection sensors of (C4,R4), (C4,R5), (C4,R6), (C5,R2), (C5,R3), and (C5, R4) become the non-sensing pads.

In a full driving state, all capacitors connected to the touch detection unit 14 is charged with Vpre which is the precharge signal (alternatively, charging signal) by using the charging means 12.

The charging means 12 is a 3-terminal type switching element or a linear element such as OPAMP that supplies the signal according to the control signal.

As the charging voltage, DC voltage including zero volt, AC voltage which is alternated, such as a square wave, a triangle wave, or a sine wave, or voltage of a type in which the DC voltage and the AC voltage are coupled with each other may be used.

The embodiment of FIG. 18 is a result of setting the sending pad by commonly applying the select signal generated by one select signal generator 400 to all muxs.

Of course, different separate select signals are provided for each mux to select the touch detection sensors positioned in the same row as the sensing pads as described in the embodiment of FIG. 14.

For example, the select signals for the muxs 31-1 to 31-5 of groups 1 to 5 are different from each other, and as a result, the touch detection sensors positioned in the first row of (C1,R1), (C2,R2), (C3,R3), and (C4,R4) become the sensing pads.

In the embodiment, the embodiment applied in FIG. 14 may be just applied.

In detail, (1) setting the sensing-non-sensing pad, (2) an embodiment in which the alternating voltages of the sensing-non-sensing pad and the remaining non-sensing pad maintain an inverse phase relationship with each other, and (3) an embodiment in which the alternating voltage applied to some non-sensing pads (e.g., the touch detection sensor positioned in ROW2 when the touch detection sensor positioned ROW1 is the sensing pad) adjacent to the sensing pad and the alternating voltage applied to the remaining non-sensing pad maintain the inverse phase relationship with each other may be just applied to the embodiment of FIG. 18.

Because of the full driving state, all touch detection sensors other than the sensing pad is connected to predetermined voltage Vlbl having a predetermined potential difference from Vpre.

The capacitance is formed between the sensing pad and the non-sensing pad by charging Vpre and applying Vlbl and in detail, the capacitance may be distinguished into the primary line-to-line capacitance or the secondary line-to-line capacitance, but the capacitance may be collectively called the sensing equivalent capacitor or the sensing equivalent capacitance.

The non-sensing pad signal line may be connected to not Vlbl but another potential, but Vlbl is preferably commonly used for simplifying the circuit.

The voltage Vlbl connected to the non-sensing pad signal line is DC potential or AC voltage including zero V.

In the embodiment of FIG. 18, the alternating voltage is applied to the line-to-line equivalent capacitor in order to detect the touch signal. Further, in order to stably isolate the charged signals, the output terminal of the charging means and the input terminal of the touch detection unit 14 are in the Hi-z state and preferably have impedance of 100 Kohm or more. When a touch input is observed, a signal charged by other means is isolated, or the signal is rapidly observed at a discharge start time while the signals charged in the capacitors are discharged, the input terminal of the touch detection unit 14 need not particularly be Hi-z.

The touch detection unit 14 detects the voltage of the sensing pad. The touch detection unit 14 detects the voltage of point P when the touch is not generated (that is, when Ct is not formed) and detects the voltage of point P when the touch is generated (that is, when Ct is formed) to acquire the touch signal by using a difference in magnitude between both detected voltages.

In the embodiment of FIG. 18, predetermined voltage Vl or Vh is applied to one side of the non-sensing pad signal line connected with the non-sensing pad. Vl represents low voltage of the alternating voltage of the present invention, Vh represents high voltage of the alternating voltage of the present invention, and the alternating voltage is acquired by alternating Vh and Vl. Vh or Vl plays the same role as Vlbl described above, that is, a role of forming the line-to-line equivalent capacitor Ceq.

The alternating voltage is applied to the non-sensing pad signal line in order to detect the touch signal within a predetermined time after the charging voltage is applied and an absolute magnitude of the alternating voltage is Vh-Vl and the potential may be changed from the high voltage Vh to the low voltage Vl or from the low voltage Vl to the high voltage Vh.

The touch detection unit 14 detects the voltage in synchronization with a rising edge at which the alternating voltage rises from the low voltage Vl to the high voltage Vh or a falling edge at which the alternating voltage falls from the high voltage Vh to the low voltage Vl. When the TDI detects the voltage in synchronization with the rising or falling edge, the TDI preferably detects the voltage after a predetermined time is delayed from an edge. The reason is that a predetermined period of time is required until the detection voltage is stabilized by Rt which is the resistance component of the sensing pad signal line 22a or Rnt which is the resistance component of the non-sensing pad.

In an embodiment of a case where the select signals are generated in the muxs of the respective groups to be different from each other and the sensing pads in the respective columns are not positioned in the same row in FIG. 18, all non-sensing pads other than (C1,R1) and (C2,R1) in column 1 is connected to the alternating voltage.

In particular, when the display device is the LCD, the alternating voltage influences the LCD to influence a display quality of the LCD. Further, even when the display device is all other display devices other than the LCD, electrical interference is caused in the display device to cause the display quality of the display device to deteriorate. One of methods for solving the deterioration of the display quality is the full driving method in which an alternating polarity of the alternating voltage of the non-sensing pad (hereinafter, referred to as sensing-non-sensing pad) which is present in the same row as the sensing pad is differentiated or the polarity of the alternating voltage of the non-sensing pad in a row different from the row in which the sensing pad is positioned is differentiated.

As already mentioned, in ROW1, (C2,R2), (C3,R3), and (C4, R4) become the sensing-non-sensing pad and the alternating voltages applied to the sensing-non-sensing pad and the remaining non-sensing pads (e.g., (C1,R2), (C2,R3), and the like) maintain the inverse phase relationship to prevent the display quality of the display device from deteriorating.

Further, the alternating voltage applied to the touch detection sensors adjacent to the sensing pad, such as the touch detection sensors (C1,R2) and (C1, R6) of the first group and the alternating voltage applied to the remaining touch detection sensors (C1,R3), (C1,R4), (C1,R5), and (C1, R6) of the first group maintain the inverse phase relationship to acquire the same effect.

The first group is applied similarly to the second, third, and fourth groups. That is, one touch detection sensor in the front and the rear of the sensing pad maintains the inverse phase relationship with the alternating voltage applied to the remaining touch detection sensors of each column.

When the alternating voltage applied to the non-sensing pad and the alternating voltage having an inverse polarity are applied in order to minimize an influence exerted to the display device in the full driving, electromagnetic energies are offset to each other, and as a result, the influence exerted to the display device is reduced.

Block Driving Operation

A block driving state may also be just applied to the embodiment of FIG. 18 as described in the embodiment of FIG. 14.

That is, since the select signal varies for each mux of each group, the touch detection sensors positioned in the first row of (C1,R1), (C2,R2), (C3,R3), and (C4,R4) positioned in the same row may become the sensing pads.

In the case of block driving, the alternating voltage of Vlbl is applied only to some of the touch detection sensors other than the sensing pad and the remaining touch detection sensors maintain the DC potential or the floating state to prevent the sensing equivalent capacitance from being generated.

Since the block driving operation for the same row is described in detail in the embodiment of FIG. 14, herein, an embodiment of a case where the sensing pads are determined in different rows for each column as illustrated in FIG. 18 will be described in detail.

Since (C1,R1) and (C2,R1) become the sensing pad in group 1, (C1,R2) and (C1, R6) close to (C1,R1) and (C2,R1) become the non-sensing pad, and as a result, Vlbl may be applied to (C1,R2) and (C1, R6).

Further, the embodiment may be applied even in group 2 similarly to column 1 of group 1.

In column 3 and column 4 of group 3 and group 4, two non-sensing pads are set in each of the front and the rear based on the sensing pad in the case of the number of non-sensing pads, and as a result, in column 3, (C3,R5), (C3,R6), (C4,R2), and (C4, R3) become the non-sensing pad to be connected to Vlbl and the remaining (C3,R3) and (C3,R4) may maintain the floating state.

In column 4, (C4,R5), (C4,R6), (C5,R2), and (C5,R3) become the non-sensing pad to be connected to Vlbl and the remaining (C4,R4) and (C5, R4) maintain the floating state to prevent the sensing equivalent capacitance from being generated similarly to column 3.

Even in the embodiment of the remapping of FIG. 18, the rotation function described in FIG. 14 may be just applied.

That is, when the touch detection sensor of ROW1 which is the start point is the sensing pad, the non-sensing pad becomes (C2,R1) and (C1, R2) and when (C1, R1) and (C2, R1) are simultaneously the sensing pads, (C1, R2) and (C1,R6) as components that become the non-sensing pad and continuously connect the start point and the end point may to detect the touch.

In the embodiment of FIG. 18, a separate signal line is provided as illustrated in FIG. 17 to configure the display device so as to perform the rotation function.

As described in detail, the touch detecting method applied in FIG. 14 may be just applied even in the case of the remapping of FIG. 18, but when the select signal generator is separately provided for each mux of each group and the sensing pads are positioned in different rows in each column, there is only a difference in that the locations of the sensing pad and the non-sensing pad are different from those of the embodiment in FIG. 14.

As described above, the present invention is not limited to the aforementioned embodiments and the accompanying drawings, and it will be obvious to those skilled in the technical field to which the present invention pertains that various substitutions, modifications, and changes may be made within the scope without departing from the technical spirit of the present invention.

The invention claimed is:

1. A device for detecting a capacitive touch signal, which detects whether a touch input means such as a finger of a human body or a conductor similar thereto is touched in a touch panel including a plurality of touch detection sensors in a matrix form, the device comprising:
   a touch drive IC (TDI) detecting whether a touch occurs by approach of the touch input means; and
   at least one sensing equivalent capacitor formed between a sensing pad signal line and a non-sensing pad signal line, the sensing pad signal line connecting a sensing pad and the touch drive IC, a non-sensing pad signal line connecting a non-sensing pad and the touch drive IC,
   wherein the touch drive IC determines whether the touch occurs by using the at least one sensing equivalent capacitor,
   wherein a magnitude of the sensing equivalent capacitor is determined by charging the sensing pad with a first voltage and applying a second voltage to the non-sensing pad, and
   wherein a first group of non-sensing pads are connected to the second voltage, and a second group of non-sensing pads are connected to DC power or have a floating state, wherein the second group of non-sensing pads are different from the first group of non-sensing pads.

2. The device of claim 1, wherein the sensing pad is a pad in which the touch is detected by the touch drive IC at a first time and the non-sensing pad is a pad in which the touch is not detected by the touch drive IC at the first time, and
   wherein the sensing pad and the non-sensing pad vary according to the time.

3. The device of claim 1, wherein the first voltage and the second voltage are a direct current (DC) voltage or alternating current (AC) voltage or a combination type of the DC voltage and the AC voltage, and the first voltage and the second voltage have different potentials to generate a potential difference.

4. The device of claim 1, wherein the touch detection in the touch drive IC is performed by a difference between a voltage $Vsensor_{touch}$ generated when a touch capacitance is generated by approaching of the touch input means for the touch detection sensor and a voltage $Vsensor_{nontouch}$ generated when the touch capacitance is not generated.

5. The device of claim 1, wherein a voltage $Vsensor_{touch}$ generated when the touch capacitance is generated by approaching of the touch input means for the touch detection sensor and a voltage $Vsensor_{nontouch}$ generated when the touch capacitance is not generated are in proportion to the magnitude of the sensing equivalent capacitor.

6. The device of claim 1, wherein a voltage $Vsensor_{touch}$ generated when the touch capacitance is generated by approaching of the touch input means for the touch detection sensor is in inverse proportion to a magnitude of the touch capacitance.

7. The device of claim 1, wherein the second voltage is an AC voltage, and
   whether the touch occurs in the touch drive IC is detected in synchronization with a falling time in which a high level of the second voltage falls to a low level.

8. The device of claim 1, wherein in the touch drive IC, when a voltage $Vsensor_{touch}$ is acquired by the touch capacitance generated by approaching of the touch input means for the touch detection sensor, a magnitude of the first voltage is larger than a magnitude of the second voltage or larger than a difference between a high value of the second voltage and a low value of the second voltage.

9. The device of claim 1, wherein in the touch drive IC, when a voltage $Vsensor_{nontouch}$ is acquired by the touch capacitance that is not generated, a magnitude of the first voltage is larger than a magnitude of the second voltage or larger than a difference between a high value of the second voltage and a low value of the second voltage.

10. The device of claim 1, wherein the first voltage and the second voltage are an AC voltage and the first voltage and the second voltage have inverse phases.

11. The device of claim 1, wherein all of the non-sensing pads maintain a DC potential or the floating state and the DC potential includes zero (0) V.

12. The device of claim 1, wherein the sensing pad is a plurality of touch detection sensors positioned in row [j], and
   the non-sensing pad is a plurality of touch detection sensors positioned in at least one row positioned between row [1] and row [j−1] or a plurality of touch detection sensors positioned in at least one row positioned between row [j+1] and row [m],
   wherein the row [j] maintains the relationship of row [1]≤row [j]≤row [m], and the row [1] represents a first row where touch detection sensors positioned most distant from the touch drive IC are positioned and the row [m] represents an m-th row where touch detection sensors positioned shortest from the touch drive IC are positioned.

13. The device of claim 12, wherein the touch detection sensors positioned in the row [j] are scanned while being divided into a plurality of subsets and each subset includes at least one touch detection sensor.

14. The device of claim 12, wherein the non-sensing pad is a plurality of touch detection sensors positioned in the row [j−1] and the row [j+1] and the second voltage applied to the non-sensing pad is an AC voltage.

15. The device of claim 12, wherein all of the touch detection sensors other than the sensing pad and the non-sensing pad maintain a DC potential or the floating state and the DC potential includes zero (0) V or a ground.

16. The device of claim 12, wherein when the sensing pad and the non-sensing pad vary by the unit of the row, if the sensing pad is a plurality of touch detection sensors positioned in the row [1], the non-sensing pad is a plurality of touch detection sensors positioned between row [2] and the row [m].

17. The device of claim 12, wherein when the sensing pad and the non-sensing pad vary by the unit of the row, if the sensing pad is a plurality of touch detection sensors positioned in the row [m], the non-sensing pad is a plurality of touch detection sensors positioned between the row [1] and row [m−1].

18. A method for detecting a capacitive touch signal, which detects whether a touch input means such as a finger of a human body or a conductor similar thereto is touched in a touch panel including a plurality of touch detection sensors in a matrix form, the method comprising:

charging at least one sensing pad among the plurality of touch detection sensors with a first voltage;

applying a second voltage to at least one non-sensing pad among the plurality of touch detection sensors; and detecting whether a touch occurs by approaching of the touch input means by using at least one sensing equivalent capacitor formed between a sensing pad signal line and a non-sensing pad signal line, the sensing pad signal line connecting a sensing pad and a touch drive IC, the non-sensing pad signal line connecting a non-sensing pad and the touch drive IC, wherein a magnitude of the sensing equivalent capacitor is determined by charging the sensing pad with the first voltage and applying the second voltage to the non-sensing pad, and wherein a first group of non-sensing pads are connected to the second voltage and a second group of non-sensing pads are connected to DC power or have a floating state, the second group of non-sensing pads being different from the first group of non-sensing pads.

* * * * *